United States Patent
Li et al.

(10) Patent No.: US 11,877,434 B2
(45) Date of Patent: Jan. 16, 2024

(54) MICROELECTRONIC DEVICES HAVING FEATURES WITH A FIN PORTION OF DIFFERENT SIDEWALL SLOPE THAN A LOWER PORTION, AND RELATED METHODS AND ELECTRONIC SYSTEMS

(71) Applicant: Micron Technology, Inc., Boise, ID (US)

(72) Inventors: Yan Li, Boise, ID (US); Song Guo, Boise, ID (US); Mohd Kamran Akhtar, Boise, ID (US); Alex J. Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 16/924,995

(22) Filed: Jul. 9, 2020

(65) Prior Publication Data

US 2022/0013527 A1 Jan. 13, 2022

(51) Int. Cl.
*H01L 21/768* (2006.01)
*H01L 23/522* (2006.01)
(Continued)

(52) U.S. Cl.
CPC ....... *H10B 12/053* (2023.02); *H01L 21/3065* (2013.01); *H10B 12/34* (2023.02)

(58) Field of Classification Search
CPC ........... H01L 27/10876; H01L 21/3065; H01L 27/10823; H01L 21/76232; H01L 23/528; H01L 27/10885; H01L 27/10888; H01L 29/0847; H01L 27/10808; H01L 29/66477; H01L 29/66621; H01L 29/0653; H01L 29/0649; H01L 29/0657; H01L 29/4236; H01L 29/78; H01L 2924/1436; H01L 2924/0002; H01L 2924/00; H01L 27/10826; H01L 27/10879; H01L 27/10; H01L 27/891; H01L 27/10882; H01L 29/668; H01L 29/18; H01L 21/823481; H01L 21/762; H01L 21/24;
(Continued)

(56) References Cited

U.S. PATENT DOCUMENTS 6,689,660 B1 2/2004 Noble et al.
9,349,737 B2 5/2016 Pulugartha et al.
(Continued)

OTHER PUBLICATIONS

Guha et al., "Apparatus with Doped Surfaces, and Related Methods with In Situ Doping," U.S. Appl. No. 16/453,788, filed Jun. 26, 2019 (45 pages).

*Primary Examiner* — Kretelia Graham
*Assistant Examiner* — Tenley H Schofield
(74) *Attorney, Agent, or Firm* — TraskBritt

(57) ABSTRACT

A method of forming a microelectronic device structure comprises exposing a silicon structure to an etching chemistry at a first bias voltage of greater than about 500 V to form at least one initial trench between sidewalls of features formed in the silicon structure. The method also comprises exposing at least the sidewalls of the features to the etching chemistry at a second bias voltage of less than about 100 V to remove material from the sidewalls to expand the at least one initial trench and form at least one broader trench without substantially reducing a height of the features. Related apparatuses and electronic systems are also disclosed.

16 Claims, 9 Drawing Sheets

(51) Int. Cl.
*H01L 23/00* (2006.01)
*H01L 23/31* (2006.01)
*H01L 23/495* (2006.01)
*H01L 23/528* (2006.01)
*H01L 23/532* (2006.01)
*H01L 25/065* (2023.01)
*H01L 25/18* (2023.01)
*H01L 25/00* (2006.01)
*H01L 21/48* (2006.01)
*H01L 21/56* (2006.01)
*H01L 23/498* (2006.01)
*H10B 12/00* (2023.01)
*H01L 21/3065* (2006.01)

(58) Field of Classification Search
CPC . H01L 21/76229; G11C 11/4085; G11C 5/06; G11C 11/24
See application file for complete search history.

(56) References Cited

U.S. PATENT DOCUMENTS

| | | | |
|---|---|---|---|
| 9,449,978 | B2 | 9/2016 | Karda et al. |
| 9,761,590 | B1 | 9/2017 | Pulugurtha et al. |
| 2004/0171254 | A1* | 9/2004 | Iijima ................ H01L 21/3065 |
| | | | 438/689 |
| 2006/0063348 | A1* | 3/2006 | Chen ................ H01L 21/76232 |
| | | | 257/E21.549 |
| 2008/0146000 | A1* | 6/2008 | Lee .................. H01L 21/76232 |
| | | | 257/E21.549 |
| 2009/0140320 | A1* | 6/2009 | Lee .................. H01L 29/42324 |
| | | | 257/321 |
| 2009/0200593 | A1* | 8/2009 | Uchiyama ....... H01L 21/823437 |
| | | | 257/E21.546 |
| 2012/0007162 | A1* | 1/2012 | Lee .................. H01L 27/11521 |
| | | | 257/E21.546 |
| 2014/0061742 | A1* | 3/2014 | Nishitani ......... H01L 27/10888 |
| | | | 257/334 |
| 2014/0252428 | A1* | 9/2014 | Chang ................ H01L 29/7851 |
| | | | 257/288 |
| 2015/0028406 | A1* | 1/2015 | Tang ................ H01L 21/76232 |
| | | | 257/773 |
| 2015/0380526 | A1* | 12/2015 | Godet ............... H01L 29/66803 |
| | | | 438/482 |
| 2016/0104709 | A1 | 4/2016 | Pulugurtha et al. |
| 2016/0133624 | A1* | 5/2016 | Liao .................. H01L 27/10823 |
| | | | 257/334 |
| 2016/0351565 | A1* | 12/2016 | Sung ................. H01L 29/7854 |
| 2018/0331220 | A1* | 11/2018 | Sung ............... H01L 21/823878 |
| 2019/0296021 | A1 | 9/2019 | Juengling |
| 2019/0326297 | A1 | 10/2019 | Ujihara et al. |

\* cited by examiner

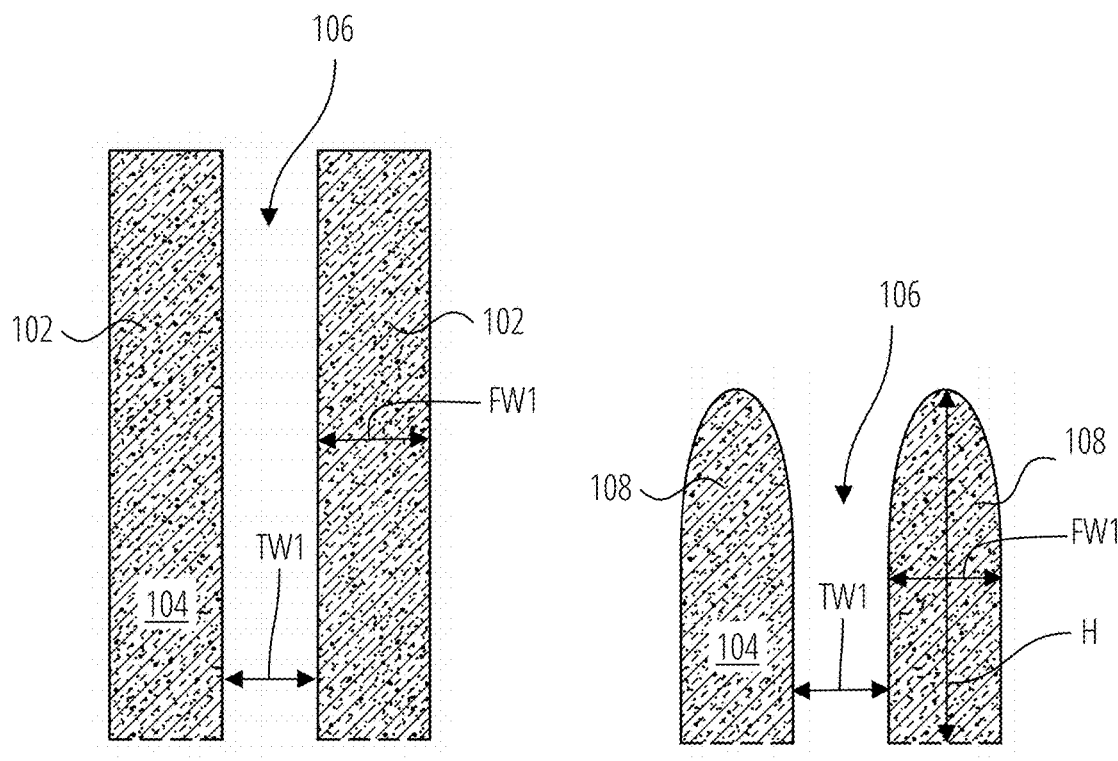
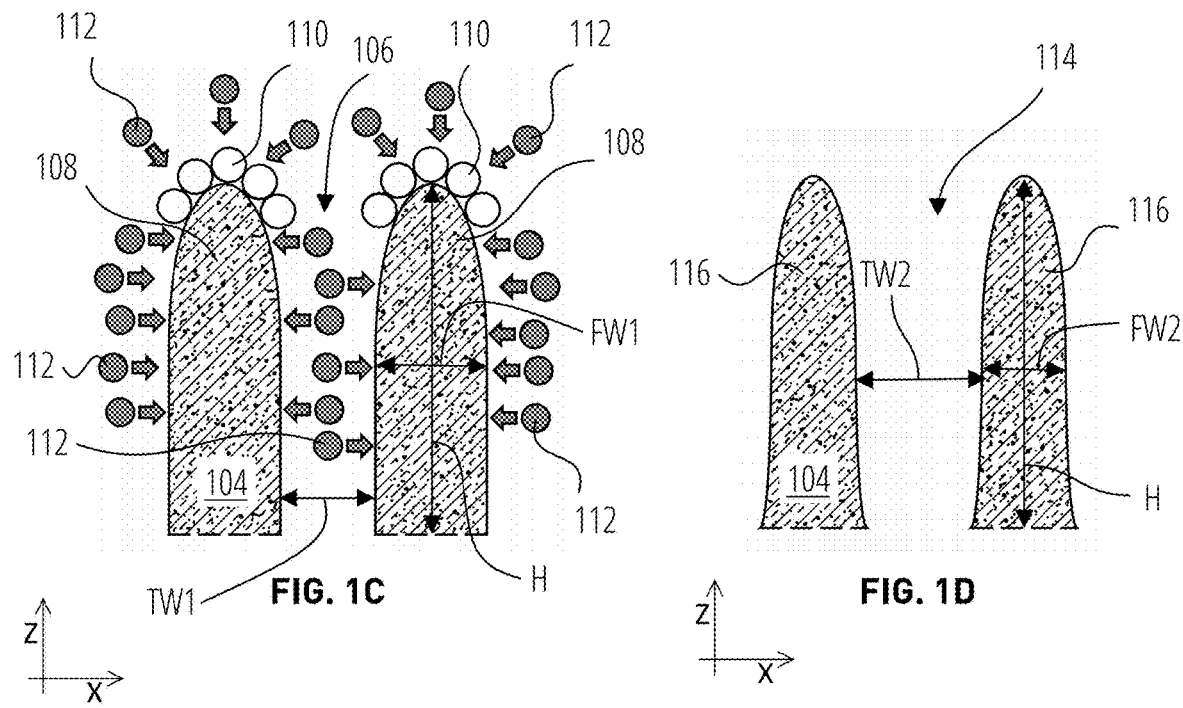

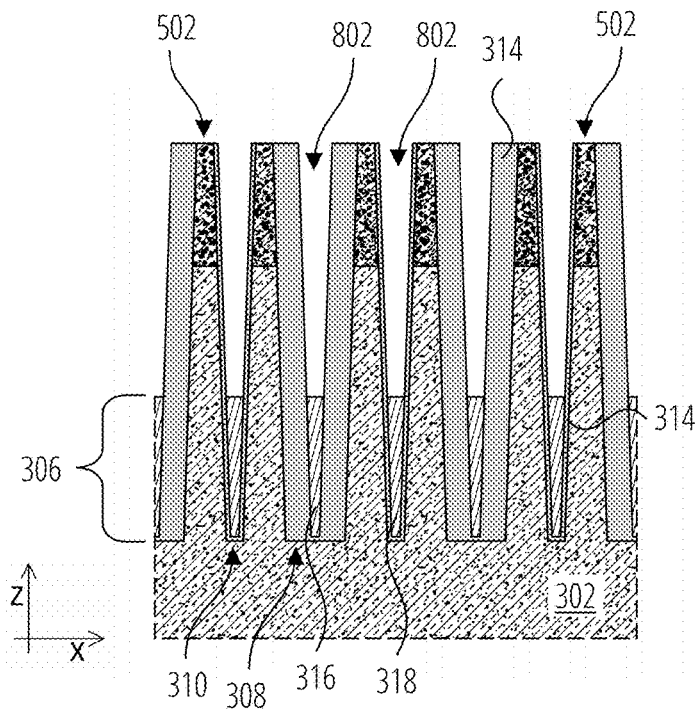
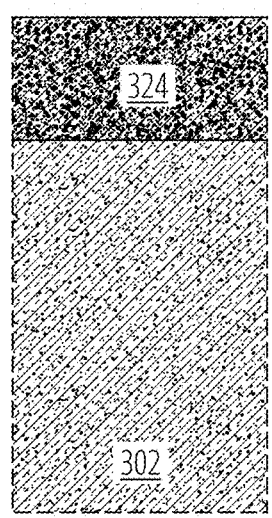
FIG. 8A   FIG. 8B
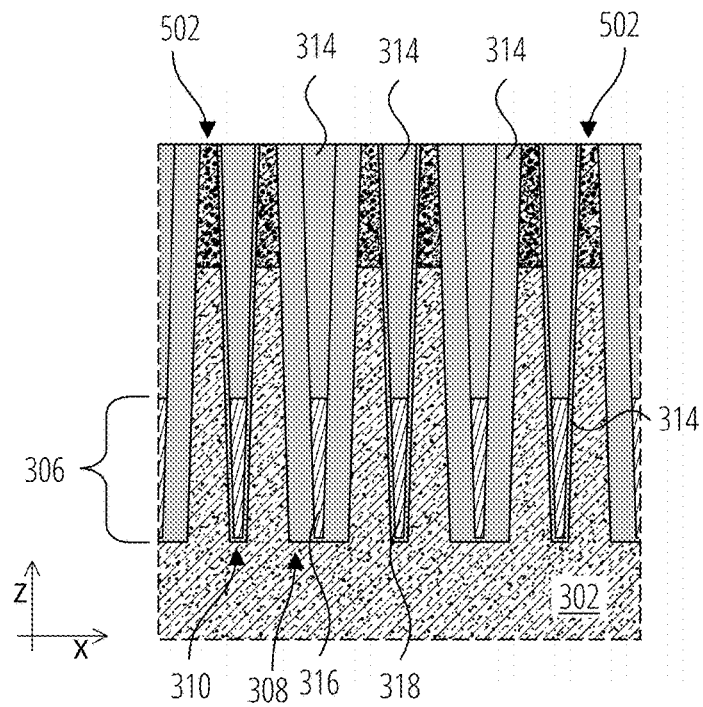
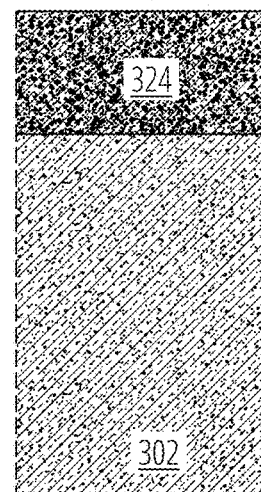
FIG. 9A   FIG. 9B

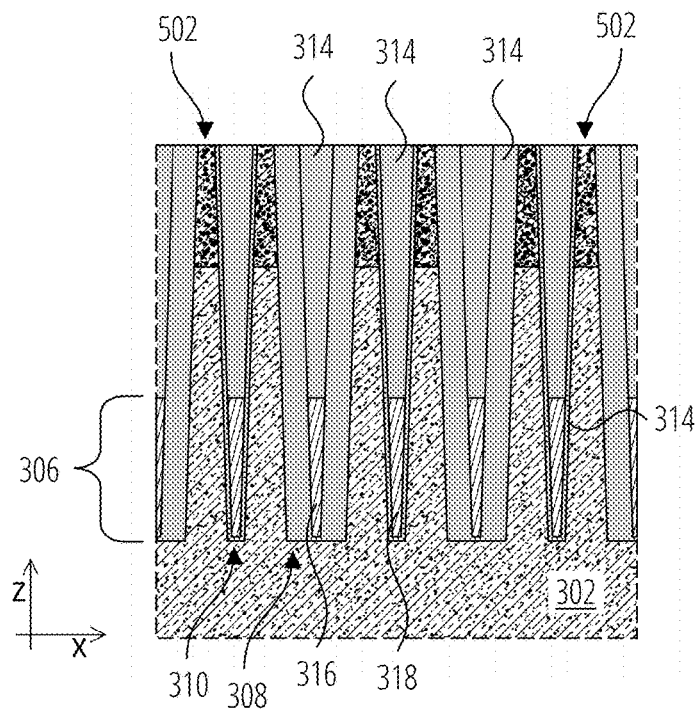 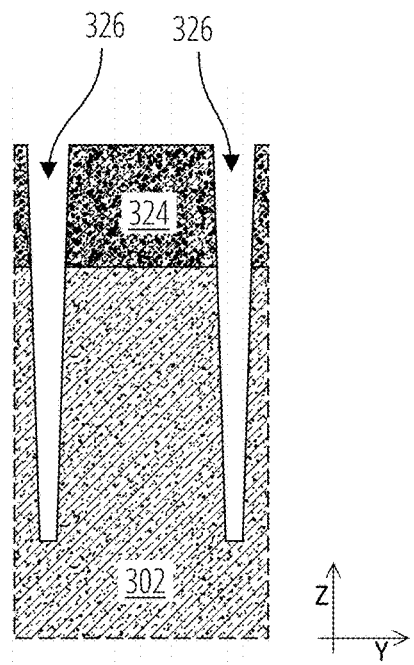
FIG. 10A  FIG. 10B
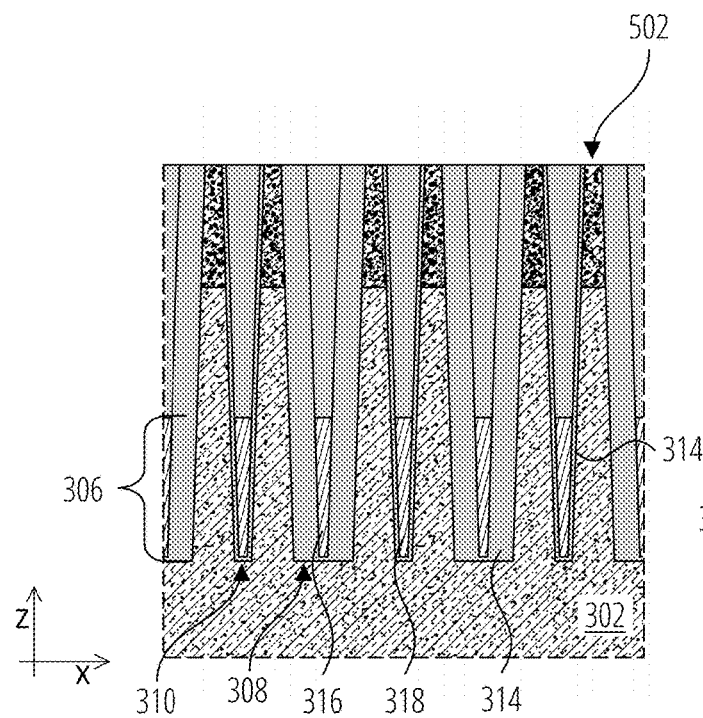 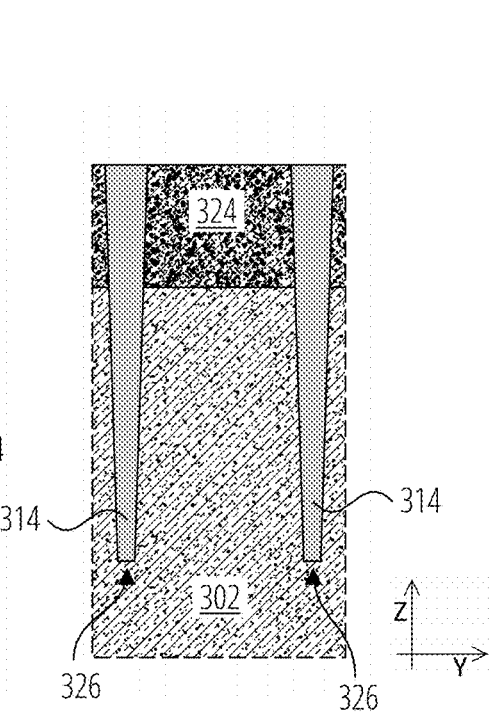
FIG. 11A  FIG. 11B

US 11,877,434 B2

MICROELECTRONIC DEVICES HAVING FEATURES WITH A FIN PORTION OF DIFFERENT SIDEWALL SLOPE THAN A LOWER PORTION, AND RELATED METHODS AND ELECTRONIC SYSTEMS

TECHNICAL FIELD

The disclosure, in various embodiments, relates generally to electronic device design and fabrication. More particularly, this disclosure relates to the fabrication of apparatuses (e.g., microelectronic devices, such as semiconductor devices, memory devices) having relatively broad openings adjacent relatively narrow structures (e.g., fins), which may be formed by a low bias, isotropic etching act following a high bias, anisotropic etching act.

BACKGROUND

Integrated circuit designs are continually being scaled down in size in efforts to increase the number of electronic devices that can occupy a given footprint, to reduce power consumption, and to increase operational speed. With each passing generation, electronic devices tend to get smaller and more densely packed, raising a number of challenges for integration, including challenges in the methods for fabricating the small, densely-packed structures of the electronic devices.

Meeting those design and fabrication challenges without sacrificing electronic device performance is a particularly difficult challenge. For example, electronic devices configured as memory devices often need to exhibit sufficient performance characteristics, such as a low refresh (e.g., the time interval at which memory cells, of the memory device, must be recharged to avoid loss of data, with refresh being a function of cell capacitance and cell junction leakage), a low write recovery time (TWR) (e.g., the time interval required between a write command to a row and precharging), and a low row hammer characteristic (e.g., a measure of a memory cell's tendency to leak charge (e.g., via junction leakage and/or gate-induced drain leakage (GIDL)) and interact electrically with a neighbor, unintentionally, which can lead to possibly changing the charge and storage of the leaking cell as well as the impacted neighboring cells of the memory device). Moreover, conductive features of electronic devices, such as access lines (e.g., "word lines") also most often need to exhibit sufficient performance characteristics, such as low electrical resistance. Designing and fabricating electronic devices and the structures of such devices in a manner that enables the electronic device (e.g., memory device) and its conductive features (e.g., word lines) to exhibit sufficient performance characteristics continues to present challenges.

BRIEF DESCRIPTION OF THE DRAWINGS

FIG. 1A through FIG. 1D are cross-sectional, elevational, schematic illustrations during various stages of processing to fabricate the structures illustrated in FIG. 1D, which may be structures of a microelectronic device (e.g., a semiconductor device, such as a memory device), the structures including relatively narrow silicon structures (e.g., fins) spaced by a relatively broad opening, in accordance with embodiments of the disclosure.

FIG. 4A through FIG. 15B are cross-sectional, elevational, schematic illustrations during various stages of processing to fabricate the microelectronic device structure illustrated in FIG. 3A and FIG. 3B, according to embodiments of the disclosure, wherein figures with like figure numbers (e.g., FIG. 4A and FIG. 4B, FIG. 5A and FIG. 5B, FIG. 6A and FIG. 6B, respectively, and so on) represent views of a same stage of processing, wherein figures designated with an "A" provide "X"-axis views consistent with section line X-X of FIG. 2 and the resulting structure of FIG. 3A, and wherein figures designated with a "B" provide "Y"-axis views consistent with section line Y-Y of FIG. 2 and the resulting structure of FIG. 3B.

DETAILED DESCRIPTION

Figure 2:
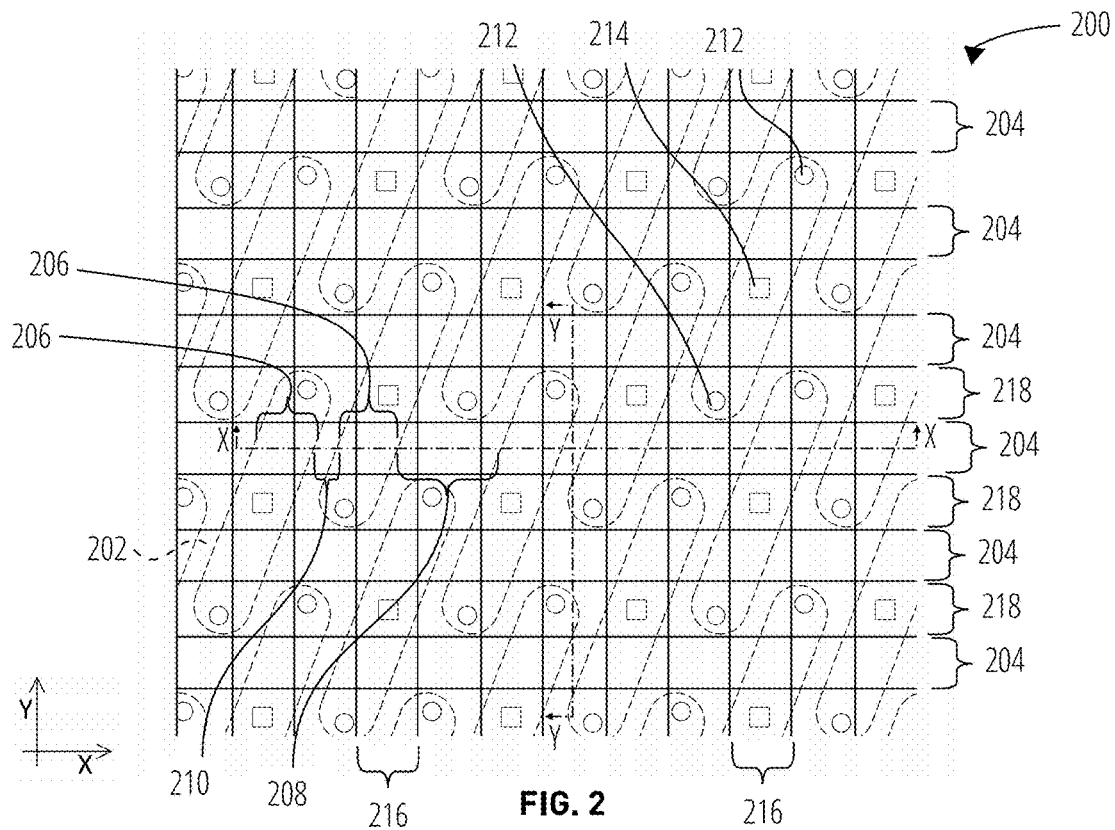
FIG. 2 is a top plan, schematic illustration of a memory cell array that includes memory devices (e.g., DRAM devices) with microelectronic device structures having relatively broad openings (e.g., trenches) adjacent relatively narrow structures (e.g., fins), in accordance with embodiments of the disclosure.

Apparatuses (e.g., devices, systems including such devices, and structures of such devices), according to embodiments of the disclosure, include relatively broad openings (e.g., trenches) adjacent relatively narrow silicon structures (e.g., fins), which may be formed by a low bias, isotropic etching act following a high bias, anisotropic etching act. The high bias, anisotropic etching act forms one or more silicon structures with tapering sidewall(s) that define one or more openings (e.g., trenches). Then, the low bias, isotropic etching act removes material from substantially only the sidewalls and at a faster rate along lower portions of the sidewalls than along upper portions (e.g., upper surfaces, upper portions of the sidewalls) of the structures, narrowing the silicon structures and broadening the base of intermediate openings (e.g., trenches) without significantly decreasing the height of the structures or intermediate openings (e.g., trenches). Accordingly, an intermediate opening (e.g., trench) may be wider than it otherwise would be (e.g., without the low bias, isotropic etching act) and with bordering sidewalls that are closer to a true vertical (e.g., a true 90 degrees relative to horizontal) than they otherwise would be. The wider opening (e.g., trench) and straighter sidewalls accommodate a relatively greater amount of conductive material to be formed in the opening (e.g., trench), as when forming a conductive structure (e.g., an elongate conductive structure, such as a word line). With a greater amount of conductive material, the conductive structure may exhibit relatively lower electrical resistivity. The relatively narrower silicon structures (e.g., narrow fins) and the relatively thicker conductive material in the opening (e.g., trench) may also enable improved control of the conductive structure during operation of the apparatus, such as improved control of the potential between neighboring conductive structures (e.g., neighboring word lines). This improved control may also enable a lower row hammer characteristic and reduce disturbing of adjacent active or passing word lines, during operation. Forming the narrow silicon structures (e.g., narrow fins) at a low bias may also enable forming the narrow fins with reduced damage to the surface of the silicon structures, which may also enable improved material quality, a lower row hammer characteristic, and lower write recovery time (TWR). The methods of forming the narrow silicon structures (e.g., narrow fins) of the apparatus may also enable the narrow silicon structures (e.g., fins) to be formed at a low horizontal critical dimension without also necessitating a smaller horizontal critical dimension of adjacent active areas. Accordingly, narrowing silicon fin structures may not significantly lessen the potential "landing area" for other conductive structures of the apparatus, such as bit line contacts.

As used herein, the term "memory device" means and includes a microelectronic device exhibiting memory functionality, but not necessarily limited to memory functionality. In other words, and by way of example only, the term "memory device" means and includes not only conventional memory in the form of DRAM, NAND, etc., but also by way of example only—an application-specific integrated circuit (ASIC) (e.g., a system on a chip (SoC)), a microelectronic device combining logic and memory, or a graphics processing unit (GPU) incorporating memory.

As used herein, the term "low bias," such as in reference to a voltage, means and includes a bias voltage of less than about 100 V (e.g., about 50 V or less).

As used herein, the term "high bias," such as in reference to a voltage, means and includes a bias voltage of greater than about 500 V (e.g., in a range from about 800 V to about 1200 V).

As used herein, the term "word line" may be otherwise known and referred to in the art as an "access line."

As used herein, the term "bit line" may be otherwise known and referred to in the art as a "digit line" or as a "sense line."

As used herein, the term "insulative," when used in reference to a material or structure, means and includes a material or structure that is electrically insulating. An "insulative" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_{-x}$—), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and/or at least one dielectric carboxynitride material (e.g., a silicon carboxynitride ($SiO_xC_zN_y$)). Formulae including one or more of "x," "y," and/or "z" herein (e.g., $SiO_x$, $AlO_x$, $HfO_x$, $NbO_{-x}$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the terms "base material," "substrate material," and "substrate" each mean and include a supportive material or other construction upon which and/or in which components, such as those within electronic devices, are formed. The base material may be a semiconductor material, a semiconductor material on another supporting structure, a metal electrode, or a semiconductor substrate having one or more materials, structures, or regions formed thereon or therein. The base material, substrate material, or substrate may consist of, consist essentially of, or comprise a conventional silicon substrate material, another bulk substrate material, or another supportive material (e.g., a metal material). As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous fabrication stages may have been utilized to form materials, regions, or junctions on or in the base structure or foundation.

As used herein, the term "opening" means a volume extending at least partially through or into at least one structure or at least one material, leaving a gap in that at least one structure or that at least one material, and/or means a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is(are) not necessarily in contact with an atmosphere or non-solid environment. Structure(s) or material(s) "exposed" within an opening may be adjacent or in contact with other structure(s) or material(s) that is(are) disposed within the opening.

As used herein, the term "trench" means and includes an elongate opening.

As used herein, the terms "horizontal" or "lateral" mean and include a direction that is parallel to a primary surface of the substrate on which or in which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis and/or parallel to an indicated "Y" axis.

As used herein, the terms "vertical" or "longitudinal" mean and include a direction that is perpendicular to a primary surface of the substrate on which or in which the referenced material or structure is located. The height of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the terms "thickness" and "thinness" mean and include a dimension in a straight-line direction that is normal to the closest surface of an immediately adjacent material or structure that is of a different composition or that is otherwise distinguishable from the material or structure whose thickness or thinness is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"—when referring to a parameter, property, or condition of one structure, material, or feature in comparison to the parameter, property, or condition of that same structure material, or feature or of another such structure, material, or feature—means and includes the parameter, property, or condition of that such structure, material or feature or of the two such structures, materials, or features being equal, substantially equal, or about equal, at least in terms of respective portions of such structures, materials, or features. For example, a structure having a sidewall of a "consistent" slope may define a same, or substantially same, sidewall slope at one elevation along such feature's sidewall as along another elevation of such same feature's sidewall.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, or used to describe the relationship of one portion of such material or feature to another portion of such material or feature as illustrated in the figures. As used herein, a "level" and an "elevation" are each defined by a horizontal plane parallel to an indicated "X" axis, to an indicated "Y" axis, or to both. "Lower levels" and "lower elevations" are nearer to a lowermost surface of a structure as illustrated and further from an uppermost surface of the structure as illustrated, while "higher levels" and "higher elevations" are further from the lowermost surface of the structure as illustrated and nearer the uppermost surface of the structure as illustrated. Unless otherwise specified, these spatially relative terms are intended to encompass different orientations of the materials in addition to the orientation as depicted in the figures. For example, the materials in the figures may be inverted, rotated, etc., with the spatially relative "level" and/or "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus—or to an operating condition or parameter of a referenced act—so as to facilitate a referenced property or operation of the referenced material, structure, assembly, or apparatus—or a referenced result of the referenced act—in a predetermined way.

The illustrations presented herein are not meant to be actual views of any particular material, species, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatuses (e.g., devices, systems) and methods. However, a person of ordinary skill in the art will understand that the embodiments of the apparatuses and methods may be practiced without employing these specific details. Indeed, the embodiments of the apparatuses and methods may be practiced in conjunction with conventional semiconductor fabrication techniques employed in the industry.

The fabrication processes described herein do not form a complete process flow for processing apparatuses (e.g., devices, systems) or the structures thereof. The remainder of the process flow is known to those of ordinary skill in the art. Accordingly, only the methods and structures necessary to understand embodiments of the present apparatuses (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1A to FIG. 1D, illustrated are various stages in a method of forming a relatively broad opening (e.g., trench) between silicon structures (e.g., silicon fins). The formation of the relatively broad opening may narrow the silicon structures themselves. With reference to FIG. 1A, vertical precursor structures 102 may be formed of a base material 104 (e.g., a semiconductor material, such as silicon (e.g., polycrystalline silicon, monocrystalline silicon)). A trench 106 (e.g., opening, aperture) may separate opposing sidewalls of the vertical precursor structures 102 by an initial trench width TW1. Subjecting the vertical precursor structures 102 to a high bias, anisotropic etching act (e.g., a dry etch at a high bias voltage) may reduce the vertical precursor structures 102 to shortened fins 108, as illustrated in FIG. 1B. The resulting shortened fins 108 may have a height H and initial fin width FW1, and they may be spaced by the initial trench width TW1 of the trench 106.

The high bias, anisotropic etch may use a relatively high bias voltage of, e.g., greater than about 500 V (e.g., a bias voltage within a range of from about 800 V to about 1200 V) and a "dry etch" chemistry (e.g., a plasma etchant composition) including one or more of $CF_4$, $C_2F_2$, $C_4F_6$, oxygen ($O_2$), HBr, and/or $Cl_2$. At the high bias voltage, species (e.g., radicals) of the etch chemistry may be of high energy and may tend to bombard or otherwise vertically attack and remove material from upper surfaces of the vertical precursor structures 102 (FIG. 1A) more quickly than from lower surfaces of the vertical precursor structures 102, which may cause the vertical precursor structures 102 to be shortened to the relatively shorter vertical height H without substantially decreasing the initial fin width FW1 and without substantially increasing the initial trench width TW1.

After forming the shortened fins 108 by the high bias, anisotropic etching act, the shortened fins 108 are then be subjected to a low bias, isotropic etching act (e.g., another dry etch) to broaden the trench 106 and narrow the shortened fins 108, as illustrated in FIG. 1C. The low bias, isotropic etching act may use the same etch chemistry (e.g., a plasma etchant composition including one or more of $CF_4$, $C_2F_2$, $C_4F_6$, oxygen ($O_2$), HBr, and/or $Cl_2$) or a different etch chemistry as used in the high bias, anisotropic etching act. Moreover, the bias voltage applied during the low bias, isotropic etching act may be significantly less than the bias voltage applied during the high bias, anisotropic etching act. For example, in embodiments in which the relatively high bias voltage is greater than about 500 V (e.g., a bias voltage in a range from about 800 V to about 1200 V), the relatively low bias voltage of the low bias, isotropic etching act may be less than about 100 V (e.g., a bias voltage of about 50 V).

Without being limited to any one particular theory, it is contemplated that—at the relatively lower bias voltage—polymerizing radicals 110 from the etchant composition (e.g., C—H radicals from the plasma etchant composition) may gather along the upper surface area of the shortened fins 108, as illustrated in FIG. 1C, while reactive radicals 112 from the etchant composition (e.g., C—F radicals from the plasma etchant composition) may still have enough energy, even at the relatively low bias voltage, to travel into the lower portions of the trench 106 and react with—and remove base material 104 from—sidewall(s) of the shortened fins 108 bordering the trench 106. Etching the sidewalls in this manner may effectively broaden (e.g., widen) the trench 106 to form broad trench 114 of FIG. 1D, which may have a greater trench width TW2, compared to the initial trench width TW1. In embodiments in which additional trenches 106 are adjacent multiple sidewalls of the vertical precursor structures 102 (FIG. 1A) and the shortened fins 108, the low bias, isotropic etching act may also narrow the shortened fins 108 to form narrow fins 116 with a fin width FW2 less than the initial fin width FW1.

As used herein, the "width" of a structure (e.g., fin) or opening (e.g., trench) may be the width measured at approximately midway along the height of such structure (e.g., fin) or opening (e.g., trench) or at approximately midway along the height of an adjacent structure or opening, unless the locale of width measurement is otherwise specified. For example, trench width TW2 may be measured at about midway along a total depth of the broad trench 114 of FIG. 1D, e.g., if the broad trench 114 does not extend further downward than that which is illustrated in FIG. 1D; alternatively, if the broad trench 114 extends further downward below what is illustrated in FIG. 1D, the trench width TW2 may alternatively be measured at about midway along the height H of the adjacent narrow fin 116.

With additional reference to FIG. 1C, it is further contemplated that—without the higher energy from the relatively high bias voltage of the high bias, anisotropic etching act—the reactive radicals 112 may not significantly "bombard" (e.g., vertically attack) the cap formed by the polymerizing radicals 110 or the underlying upper portions of the shortened fins 108. Moreover, without the higher energy, the reactive radicals 112 may also not significantly bombard (e.g., vertically attack) material exposed at a base of the trench 106. Accordingly, as illustrated in FIG. 1D, resulting narrow fins 116 may have substantially the same height H as the shortened fins 108 prior to the transition to the low bias, isotropic etching act.

The bias voltage of the low bias, isotropic etching act may be selected and tailored to be high enough to deliver the reactive radicals 112 to a base of the trench 106 and structures (e.g., shortened fins 108) exposed to the etch chemistry (e.g., the plasma etchant composition), but low enough to enable the material removal to be significantly greater in the lateral direction (e.g., sidewall reaction) than in the vertical direction (e.g., bombardment), enabling the low bias etching act to be an isotropic etching act, rather than an anisotropic etching act as in the high bias etching act.

In some embodiments, the high bias, anisotropic etching act may be carried out for a significantly longer period of time than the low bias, isotropic etching act. For example, the high bias, anisotropic etching act may expose the vertical precursor structures 102 (FIG. 1A) to the etchant for a period of greater than about 300 seconds (e.g., 305 seconds, about 306 seconds), while the subsequent low bias, isotropic etching act may expose the shortened fins 108 (FIG. 1C) to the etchant for a period of less than about 10 seconds (e.g., about 8 seconds).

In some embodiments, transitioning from the high bias, anisotropic etching act to the low bias, isotropic etching act may consist substantially of lowering the bias voltage from a first bias voltage (e.g., the voltage level of the high bias) to a second bias voltage (e.g., the voltage level of the low bias) without, for example, removing materials, chemicals, or species from the environment to which the structure(s) being etched are exposed. For example, in some embodiments, the bias voltage may be lowered from the high bias level to the low bias level while the structure(s) that have been, are being, or will be etched are within an etching chamber, e.g., without a purge, air gap, or vacuum act to remove any materials, chemicals, or species from the etching chamber between the high bias act and the low bias act.

In some embodiments of the method of FIG. 1A through FIG. 1D, the high bias, anisotropic etching act may be used to form the trench 106, as well as to form the shortened fins 108 of FIG. 1B, before the low bias, isotropic etching act is carried out as in FIG. 1C to form the narrow fins 116 and adjacent broad trench 114 of FIG. 1D.

In other embodiments, the high bias, anisotropic etching act may be used to form the trench 106 of FIG. 1A—vertically etching the trench 106 into a monolithic structure of the base material 104 (e.g., using a hard mask structure over those portions of the base material 104 that are to form the vertical precursor structures 102)—before proceeding to the low bias, isotropic etching act, without shortening the base material 104 (FIG. 1B). For example, in such an embodiment, the vertical precursor structures 102 of FIG. 1A may not represent distinct structures, but the illustrated vertical precursor structures 102 may represent portions of masses that extend laterally and/or vertically beyond what is illustrated as outer sidewalls or lower surfaces of the vertical precursor structures 102 of FIG. 1A. After forming the structure of FIG. 1A by the high bias, anisotropic etching act, the structure of FIG. 1A may be exposed to the low bias, isotropic etching act (e.g., with a protective hard mask structure on the upper surfaces of the base material 104) to broaden the trench 106 from the initial trench width TW1 to the trench width TW2 without substantially shortening the height of the vertical precursor structures 102 or the sidewalls of the trench 106 or the broad trench 114. In such embodiments, the resulting broad trench 114 may represent an isolation trench or other trench, may represent an opening for a conductive feature such as a bit contact, or may represent another opening or trench of a microelectronic device structure.

Accordingly, disclosed is a method of forming a microelectronic device structure. The method comprises exposing a silicon structure to an etching chemistry at a first bias voltage of greater than about 500 V to form at least one initial trench between sidewalls of features formed in the silicon structure. The method also comprises exposing at least the sidewalls of the features to the etching chemistry at a second bias voltage of less than about 100 V to remove material from the sidewalls to expand the at least one initial trench and form at least one broader trench without substantially reducing a height of the features.

Methods such as that of FIG. 1A through FIG. 1D may be used to form structures of various apparatuses. The apparatuses of this disclosure may be microelectronic devices (e.g., semiconductor devices (e.g., silicon-based semiconductor devices; other semiconductor-based devices), memory devices (e.g., dynamic random access memory (DRAM) devices; Flash memory, such as NAND Flash memory devices)), other types of electronic devices, arrays thereof, or combinations thereof.

With reference to FIG. 2, illustrated is a memory cell array 200 of an electronic device (e.g., a memory device, such as a DRAM memory device), wherein structures of the memory cell array 200 may be formed, e.g., by methods of the disclosure, to include structures according to embodiments of the disclosure.

The memory cell array 200 includes active areas 202—approximately indicated by dashed ovals in FIG. 2—which active areas 202 may be aligned at an angle, relative to word lines 204 that are aligned parallel to an "X" axis. In a horizontal, "X"-axis direction, the word lines 204 extend over a series of fins 206, which may have been formed using, e.g., the method discussed above with regard to FIG. 1A to FIG. 1D and/or using methods discussed below, including a low bias, isotropic etching act following at least one high bias, anisotropic etching act. Therefore, the fins 206 may be relatively narrow (e.g., with a fin width FW2 (FIG. 1D) of about 12 nm or less), and trenches intermediate to the fins 206—such as first trenches 208 and second trenches 210—may be relatively broad, e.g., in horizontal dimension along the "X" axis and/or along the "Y" axis, as discussed further below.

Within the active areas 202 are drain regions 212 adjacent the sides of the active areas 202. Also within the active areas 202 is a source region 214. The active areas 202 also include a couple of the fins 206, with the source region 214 between the fins 206, and with the drain regions 212 to the outside of the fins 206. A pair of the word lines 204 pass over the pair of fins 206 of each of the active areas 202, and another pair of the word lines 204 pass adjacent to the drain regions 212, adjacent the ends of the active areas 202.

Aligned parallel to a "Y" axis (e.g., aligned horizontally perpendicular to the "X" axis) are a series of bit lines 216, which may be in operable contact (e.g., via conductive structures such as "bit contacts") to the source regions 214 the bit lines 216 pass over. Each of the bit lines 216 may cross over and be perpendicularly aligned relative to a number of the word lines 204 and to features (e.g., doped features 218) of the memory cell array 200 structure that are interposed between the word lines 204. The perpendicular arrangement of the word lines 204 relative to the bit lines 216 allows for a select active area 202 (e.g., a select memory cell of the memory cell array 200) to be selected and written to or read from during operation of the electronic device that includes the memory cell array 200.

Figures 3A, 3B:
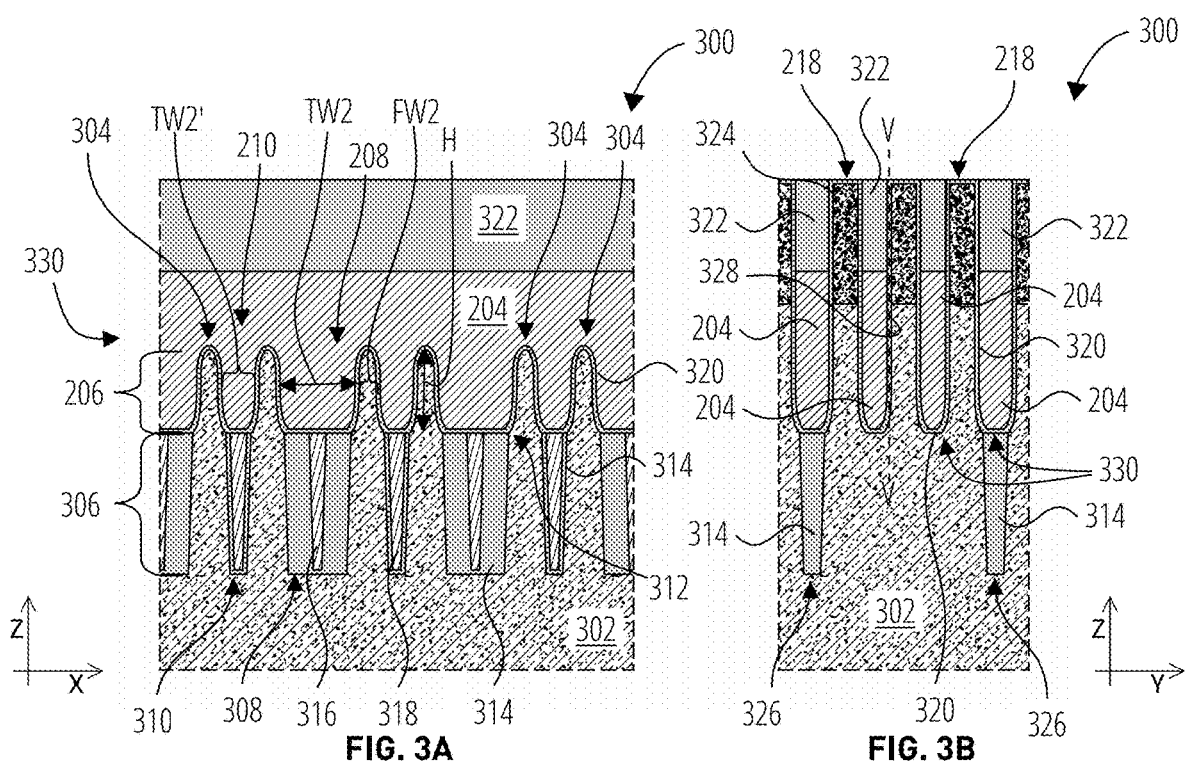
FIG. 3A is a cross-sectional, elevational, schematic illustration of a microelectronic device structure, e.g., of the memory cell array of FIG. 2, taken along section line X-X of FIG. 2, providing an "X"-axis view of the structure.
FIG. 3B is a cross-sectional, elevational, schematic illustration of the microelectronic device structure, e.g., of the memory cell array of FIG. 2, taken along section line Y-Y of FIG. 2, providing a "Y"-axis view of the structure.

FIG. 3A and FIG. 3B illustrate a microelectronic device structure 300 of the memory cell array 200 of FIG. 2, wherein FIG. 3A is an elevational schematic illustration taken along line X-X of FIG. 2, and wherein FIG. 3B is an elevational schematic illustration taken along line Y-Y of FIG. 2.

As illustrated in FIG. 3A, the fins 206 may be formed in and include one or more base material 302 (e.g., a semiconductor material, such as silicon (e.g., polysilicon, monocrystalline silicon)). For example, the fins 206 may be formed in an upper portion of vertical structures 304 formed in the base material 302. The vertical structures 304 may include, below the fins 206, lower portions 306 that are spaced from neighboring lower portions 306 by trenches, such as isolation trenches 308 and additional trenches 310. The isolation trenches 308 may be vertically below the first trenches 208, while the additional trenches 310 may be vertically below the second trenches 210.

Because of the method that may be used to form the fins 206, the first trenches 208, and the second trenches 210—such as a method that includes the low bias, isotropic etching act after at least one high bias, anisotropic etching act—sidewalls of the fins 206 may be somewhat recessed relative to sidewalls of the lower portions 306 of the vertical structures 304. For example, the fin width FW2 may be less than an uppermost width of the lower portion 306 of the vertical structures 304. Where the sidewall of the fin 206 of the vertical structure 304 meets the sidewall of the lower portion 306 of the vertical structure 304, a corner 312 may be defined. Such a corner 312 may be in contrast to a more gradual change of slope between two such sidewall portions, with substantially no distinction in the sidewall between the fin 206 and the lower portion 306 of the vertical structure 304, which gradual change of slope may otherwise result in a fabrication method not including the low bias, isotropic etching act.

Within each of the isolation trenches 308 and the additional trenches 310 may be insulative material(s) 314 (e.g., one or more of the insulative materials identified above). In some embodiments, conductive structures, such as passing word lines 316 and active word lines 318, may also be included within the structures of insulative material(s) 314 of the isolation trenches 308 and the additional trenches 310, respectively. The passing word lines 316 and the active word lines 318 may be elongate conductive structures that extend parallel to the "Y" axis (FIG. 2), substantially horizontally perpendicular to the word lines 204.

The word lines 204 (and, in some embodiments, also the passing word lines 316 and the active word line 318) are elongate conductive structures formed of and including one or more conductive materials (e.g., one or more of titanium (Ti), tungsten (W), ruthenium (Ru), cobalt (Co), an alloy of any of the foregoing, or one or more compounds or combinations thereof (e.g., TiNiW)). A liner 320 may be disposed between the word lines 204 and underlying and neighboring materials, such as the base material 302 and such as the insulative material(s) 314 and/or the conductive material(s) of the passing word lines 316 and the active word lines 318 in the isolation trenches 308 and additional trenches 310. The liner 320 may be formed of and include, e.g., any one or more of the above-identified insulative material(s), which may be of a same or a different composition as the insulative material(s) 314 within the isolation trenches 308 and the additional trenches 310.

Above each of the word lines 204 may be an insulative cap structure 322. The insulative cap structures 322 may be formed of and include one or more of the above-identified insulative material(s), which may be of a same or a different composition as the insulative material(s) 314 and/or the liner 320. From the "Y"-axis view, illustrated in FIG. 3B, neighboring insulative cap structures 322 may be spaced from one another, e.g., by the liner 320 and by doped portions 324 of the doped features 218.

Along the "X"-axis direction—as illustrated in FIG. 3A—the word lines 204 extend over and between the fins 206. Along the "Y"-axis direction—as illustrated in FIG. 3B—the word lines 204 are spaced by the doped features 218. The doped features 218 may be formed of and include the base material 302 with one or more dopants included (e.g., implanted in an upper portion of the base material 302). Also, as illustrated in FIG. 3B, along the "Y"-axis direction, some of the word lines 204 may be above other isolation trenches 326, which may also be substantially filled with the insulative material(s) 314.

The word lines 204 are disposed in word line trenches 330, formed in the base material 302, between the doped features 218 (FIG. 3B). As illustrated in FIG. 3A, along the "X"-axis direction, the fins 206, the first trenches 208, and the second trenches 210 are defined along a lower portion of the word line trenches 330. Portions of the word line trenches 330 and the word lines 204 extend downward between neighboring fins 206, such as in the first trenches 208 and in the second trenches 210.

As discussed further below, the word line trenches 330, and the fins 206 therein, may be formed using the low bias, isotropic etching act following a high bias, anisotropic etching act. Therefore, the first trenches 208 and the second trenches 210, along the lower portion of the word line trenches 330, may be relatively broad—e.g., along the "X"-axis direction illustrated in FIG. 3A—due to the use of the low bias, isotropic etching act. For example, a trench width TW2' of the second trenches 210 may be greater than about 8 nm (e.g., greater than about 9 nm, such as about 10 nm), and a trench width TW2 of the first trenches 208 may be even greater. Concurrently, the word line trenches 330 may also be relatively broad in their "Y"-axis dimension due to the use of the low bias, isotropic etching act. For example, the width of the word line trenches 330 (and, therefore, also the word lines 204) illustrated in FIG. 3B (e.g., the "Y"-axis view) may be wider than they would otherwise have been without use of the low bias, isotropic etching act. The widening of the word line trenches 330—using the low bias, isotropic etching act—may also form sidewalls 328 (FIG. 3B) (e.g., of the doped features 218 and defining sides of the word line trenches 330) that are substantially more vertical (e.g., nearer to a true ninety-degree vertical, as indicated by dashed line V-V) than they otherwise would have been without use of the low bias, isotropic etching act. For example, in some embodiments, the sidewalls 328 may be within about one degree from a true ninety-degree vertical (e.g., the sidewalls 328 may define an angle, relative to horizontal, in a range from about eighty-nine degrees to about ninety degrees).

Because the word line trenches 330—in both the "Y"-axis direction (FIG. 3B) and the "X"-axis direction (FIG. 3A)—may be formed to be relatively broad (e.g., wide), the amount (e.g., volume) of the conductive material of the word lines 204 within the word line trenches 330 (including in the first trenches 208 and the second trenches 210) and, therefore, within the word lines 204 themselves, may be greater than it may otherwise have been without use of the low bias, isotropic etching act. With the relatively greater volume of conductive material in the word line trenches 330 (and in the word lines 204 themselves), the word lines 204 may exhibit lower electrical resistance, an improved performance parameter of the electrical device that includes the memory cell array 200 of FIG. 2 and the microelectronic device structures 300 of FIG. 3A and FIG. 3B. Moreover, the relatively narrower fins 206 and the relatively thicker conductive material of the word lines 204 may enable improved control of the word lines 204, such as improved control of the electrical potential between neighboring word lines 204. The improved control of the word lines 204 may also enable a lower row hammer characteristic and reduced "disturb" between the word lines 204 and either or both of the active word lines 318 and/or the passing word lines 316, during operation of the electronic device that includes the memory cell array 200 (FIG. 2) and the microelectronic device structures 300 (FIG. 3A and FIG. 3B).

Accordingly, disclosed is an apparatus comprising a memory cell array. The memory cell array comprises microelectronic device structures. At least one of the microelectronic device structures comprises features comprising silicon. Each feature, of at least one pair of the features, comprises a lower portion and a fin portion above the lower portion. The lower portion has a tapering sidewall adjacent a trench at least partially filled with insulative material. The fin portion comprises a sidewall defining a different slope above the insulative material than a slope of the tapering sidewall of the lower portion of the feature. The at least one of the microelectronic device structures also comprises elongate conductive structures above the features. The elongate conductive structures comprise portions laterally adjacent the fin portion of the each feature of the at least one pair of the features.

FIG. 4A through FIG. 15B illustrate various stages of a method that may be used to form the microelectronic device structure 300 of FIG. 3A and FIG. 3B, and therefore the structures of the memory cell array 200 of FIG. 2. Of the figures of FIG. 4A through FIG. 15B, figures with like figure numbers (e.g., FIG. 4A and FIG. 4B, FIG. 5A and FIG. 5B, FIG. 6A and FIG. 6B, respectively, and so on) represent views of a same stage of processing; figures designated with an "A" provide "X"-axis views consistent with section line X-X of FIG. 2 and the view of FIG. 3A; and figures designated with a "B" provide "Y"-axis views consistent with section line Y-Y of FIG. 2 and the view of FIG. 3B.

Figures 4A, 4B:
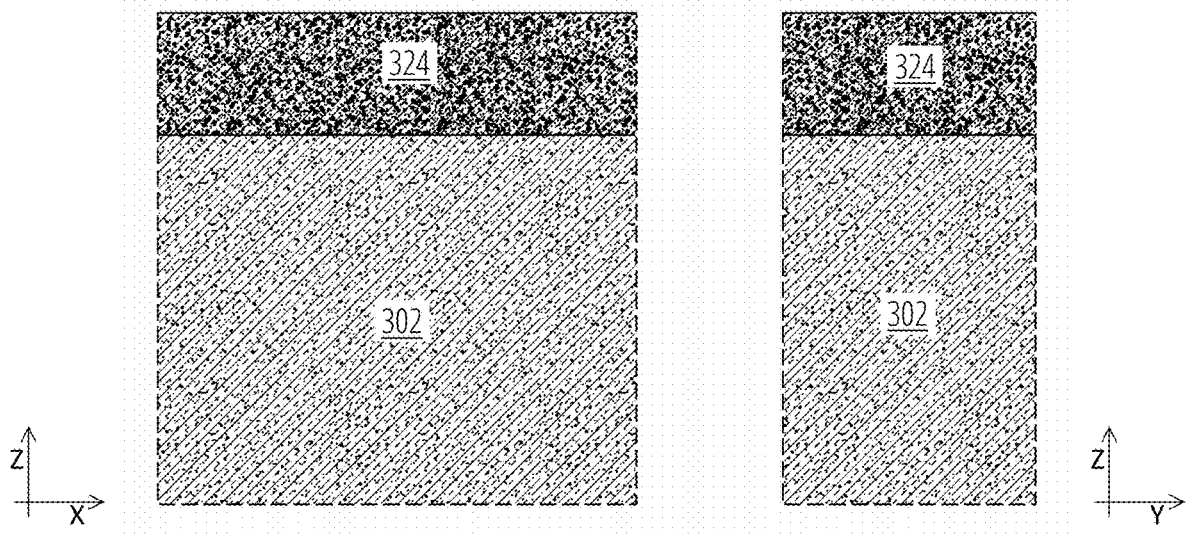

With collective reference to FIG. 4A and FIG. 4B, a doped portion 324 may be formed atop the base material 302, e.g., by adding (e.g., implanting) into an upper portion of the base material 302 one or more dopants (e.g., one or more n-type dopants, such as phosphorous (P) and/or arsenic (As); and/or one or more p-type dopants, such as boron (B) and/or indium (In)). The doped portion 324 may be formed adjacent an entirety of an upper surface of the base material 302 or may be formed substantially only in the surface portions where the active areas 202 (FIG. 2) are to be present in the final memory cell array 200 (FIG. 2).

Figures 5A, 5B:
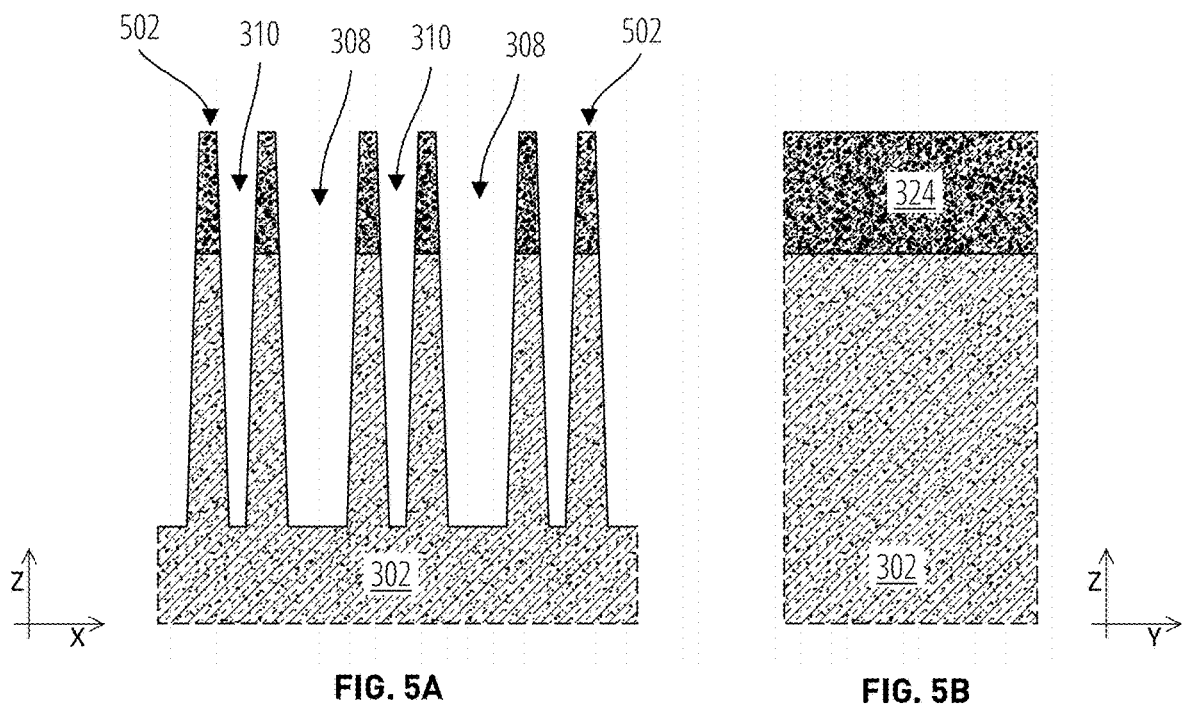

With collective reference to FIG. 5A and FIG. 5B, the isolation trenches 308 and the additional trenches 310 may be formed (e.g., etched parallel to the "Y"-axis) into the base material 302, through the doped portion 324, defining structures 502 between neighboring trenches of the isolation trenches 308 and the additional trenches 310. The isolation trenches 308 may be broader than the additional trenches 310, and both the isolation trenches 308 and the additional trenches 310 may be elongate apertures that are parallel to the "Y"-axis of FIG. 2. The structures 502 may also be elongate structures that are parallel to the "Y"-axis of FIG. 2.

In some embodiments, the isolation trenches 308 and the additional trenches 310 may be formed after doping the base material 302 to form the doped portion 324. In other embodiments, the isolation trenches 308 and the additional trenches 310 may be formed before doping the base material 302 to form the doped portions 324 of FIG. 5A.

In some embodiments, the isolation trenches 308, the additional trenches 310 or both may be formed, at least in part, by using a low bias, isotropic etch following a high bias, anisotropic etch, such as that described above with respect to FIG. 1A through FIG. 1D. Accordingly, sidewalls of the structures 502—e.g., the sidewalls that define the sides of the isolation trenches 308 and/or the additional trenches 310—may be closer to true ninety-degree vertical than they otherwise would be, and the trenches (e.g., the isolation trenches 308, the additional trenches 310, or both) may be wider—particularly near the base thereof—than they otherwise would be. In other embodiments, the isolation trenches 308, the additional trenches 310, or both may be formed by conventional techniques that do not include a low bias, isotropic etching act following a high bias, anisotropic act.

During such formation of the isolation trenches 308 and the additional trenches 310, an upper surface of the structures 502 may be covered by, e.g., a hard mask structure that defines the pattern for the isolation trenches 308 and/or the additional trenches 310. The hard mask structure may prevent the upper portions of the structures 502 (e.g., the doped portions 324 of the structures 502) from being removed by the etching acts (e.g., high bias, anisotropic etching act(s)) forming the isolation trenches 308 and/or the additional trenches 310.

Figures 6A, 6B:
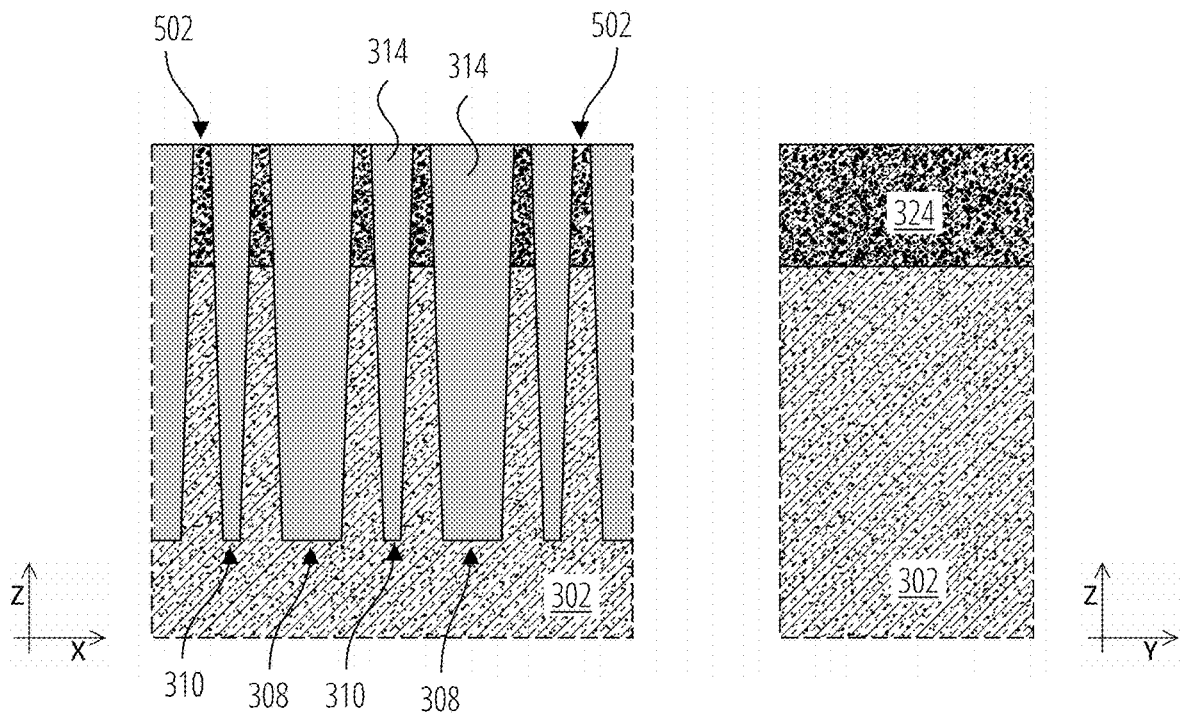

With collective reference to FIG. 6A and FIG. 6B, the insulative material(s) 314 may then be formed (e.g., deposited) to fill or substantially fill the isolation trenches 308 and the additional trenches 310. The structure of FIG. 6A and FIG. 6B may be planarized (e.g., by CMP) so that an upper surface of the insulative material(s) 314 may be coplanar with an upper surface of the structures 502 and with an upper surface of the doped portion 324 of the base material 302.

Figures 7A, 7B:
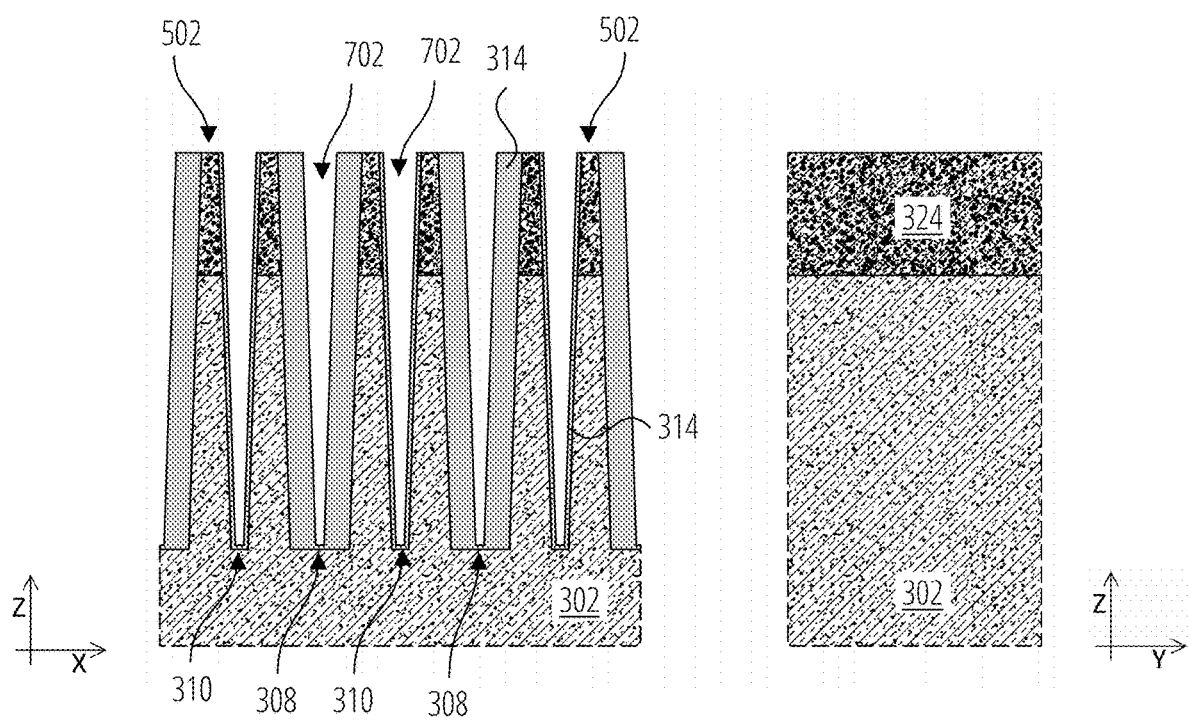

With collective reference to FIG. 7A and FIG. 7B, openings 702 may be formed (e.g., etched) into the insulative material(s) 314 of the isolation trenches 308 and the additional trench 310, leaving at least some of the insulative material(s) 314 along sides and a base of the isolation trenches 308 and the additional trenches 310.

In some embodiments, each of the openings 702— whether in the isolation trenches 308 or in the additional trenches 310—may be formed of approximately the same dimensions (e.g., with each of the openings 702 defining substantially the same top width). In other embodiments, the openings 702 of the isolation trenches 308 may be formed to be wider than the openings 702 of the additional trenches 310.

With collective reference to FIG. 8A, and FIG. 8B the conductive material of the passing word lines 316 and of the active word lines 318 may then be formed (e.g., deposited) in at least the lower portions 306 of the isolation trenches 308 and the additional trenches 310, respectively, leaving openings 802 above the passing word lines 316 and the active word lines 318.

With collective reference to FIG. 9A and FIG. 9B, the openings 802 of FIG. 8A may then be filled by forming additional amounts of the insulative material(s) 314 in the openings 802, forming the structure of FIG. 9A.

With collective reference to FIG. 10A and FIG. 10B, other isolation trenches 326 may then be formed (e.g., etched parallel to the "X"-axis) into the base material 302, through the doped portion 324. The other isolation trenches 326 (FIG. 10B) may be etched to define a depth about equal to the depth of the isolation trenches 308 (FIG. 10A) and the additional trenches 310 (FIG. 10A). The other isolation trenches 326 (FIG. 10B) may be elongate openings that extend parallel to the "X" axis of FIG. 2.

In some embodiments, the other isolation trenches 326 may be formed, at least in part, by using a low bias, isotropic etch following a high bias, anisotropic etch, such as that described above with respect to FIG. 1A through FIG. 1D. Accordingly, sidewalls of the base material 302 that define the sides of the other isolation trenches 326 may be closer to true ninety-degree vertical than they otherwise would be, and the other isolation trenches 326 may be wider—particularly near the base thereof—than they otherwise would be. In other embodiments, the other isolation trenches 326 may be formed by conventional techniques that do not include a low bias, isotropic etching act following a high bias, anisotropic act.

During such formation of the other isolation trenches 326, an upper surface of the base material 302 (e.g., an upper surface of the doped portion 324 of the base material 302) may be covered by, e.g., a hard mask structure that defines the pattern for the other isolation trenches 326. The hard mask may prevent the upper portions (e.g., the doped portions 324) of the base material 302 from being removed by the etching acts (e.g., high bias, anisotropic etching act(s)) used to form the other isolation trenches 326.

With collective reference to FIG. 11A and FIG. 11B, additional amounts of the insulative material(s) 314 may be formed (e.g., deposited) in the other isolation trenches 326 to fill the other isolation trenches 326, as illustrated in FIG. 11B. In some embodiments, the insulative material(s) 314 may be formed to overfill the other isolation trenches 326, then the structure may be planarized so that an upper surface of the insulative material(s) 314 of the other isolation trenches 326 may be coplanar with an upper surface of the doped portions 324 of the base material 302 and with an upper surface of the structures 502 and the insulative material(s) 314 of the isolation trenches 308 and the additional trenches 310.

Figures 12A, 12B:
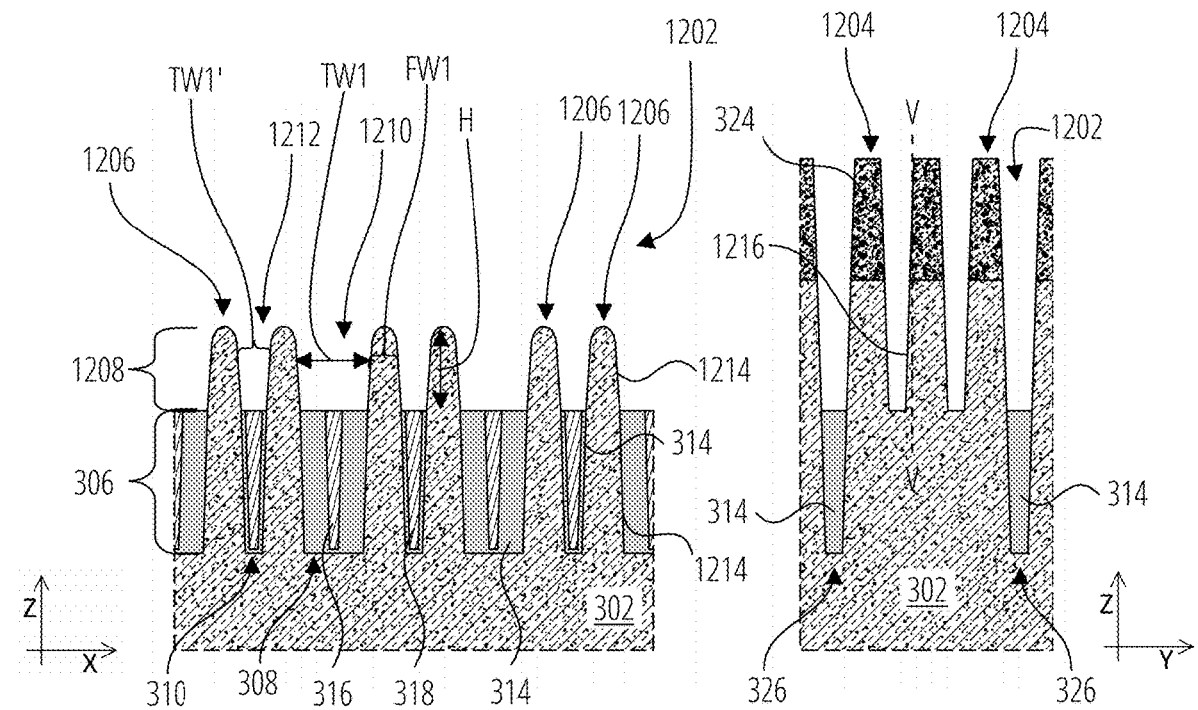

With collective reference to FIG. 12A and FIG. 12B, initial word line trenches 1202 may then be formed (e.g., etched) parallel to the "X" axis using, e.g., a high bias, anisotropic etching act, as described above with respect to FIG. 1B. A hard mask structure may be used to define the pattern for the initial word line trenches 1202, resulting in doped structures 1204 intermediate to the initial word line trenches 1202 (e.g., as illustrated in the "Y"-axis view of FIG. 12B). That is, a hard mask structure may be present over the portions of the base material 302 (e.g., over the doped portions 324 of the base material 302) that are to be included in the doped structures 1204, while the structures 502 (FIG. 11A) and the insulative material(s) 314 along the areas of the initial word line trenches 1202 are exposed to the etching chemistry (e.g., etchant plasma composition) of the high bias, anisotropic etching act. The high-energy bombardment of radicals (e.g., the reactive radicals 112 (FIG. 1C) and/or the polymerizing radicals 110 (FIG. 1C)) from the etching chemistry may cause the structures 502 (FIG. 11A) to be substantially reduced in height, while the insulative material(s) 314 are reduced even more in height. Accordingly, an upper surface of the insulative material(s) 314 may be vertically recessed relative to the upper surface of the base material 302 (from the structures 502 of FIG. 11A), forming vertical structures 1206 with upper fin portions 1208 (of height H, relative to the upper surface of the base material 302, and initial fin width FW1) above the lower portions 306. The upper fin portions 1208 adjacent the isolation trenches 308 define first initial trenches 1210 with initial trench widths TW1, while the upper fin portions 1208 adjacent the additional trenches 310 define second initial trenches 1212 with initial trench widths TW1, which may be less than the initial trench widths TW1 of the first initial trenches 1210.

In some embodiments, forming the initial word line trenches 1202 (and therefore also forming—in the base of the initial word line trenches 1202—the first initial trenches 1210, the second initial trenches 1212, and the upper fin portions 1208 of the vertical structures 1206) by the high bias, anisotropic etching act may result in sidewalls 1214 of the upper fin portions 1208 of the vertical structures 1206 having a substantially consistent slope along both the lower portion 306 and the upper fin portion 1208 of the second initial trenches 1212. Accordingly, at this stage of the method, there may not be a distinctive transition in slope (e.g., a corner) of the sidewalls 1214 between the lower portions 306 and the upper fin portions 1208 of the vertical structures 1206. Moreover, the sidewall 1214 of the vertical structures 1206 and sidewalls 1216 of the doped structures 1204 may taper, such that the initial word line trenches 1202, the first initial trenches 1210, and the second initial trenches 1212 may be broadest along an uppermost elevation thereof and narrowest at a lowest elevation thereof, adjacent the insulative material(s) 314 at the base of the initial word line trenches 1202. In some embodiments, for example, a slope of the sidewalls 1216 of the initial word line trenches 1202 may be more than one degree from a true ninety-degree vertical, represented by line V-V of FIG. 12B (e.g., at an angle of less than eighty-nine degrees, relative to horizontal, relative to an upper surface of the insulative material(s) 314, and/or relative to an upper surface of the doped structures 1204).

Figures 13A, 13B:
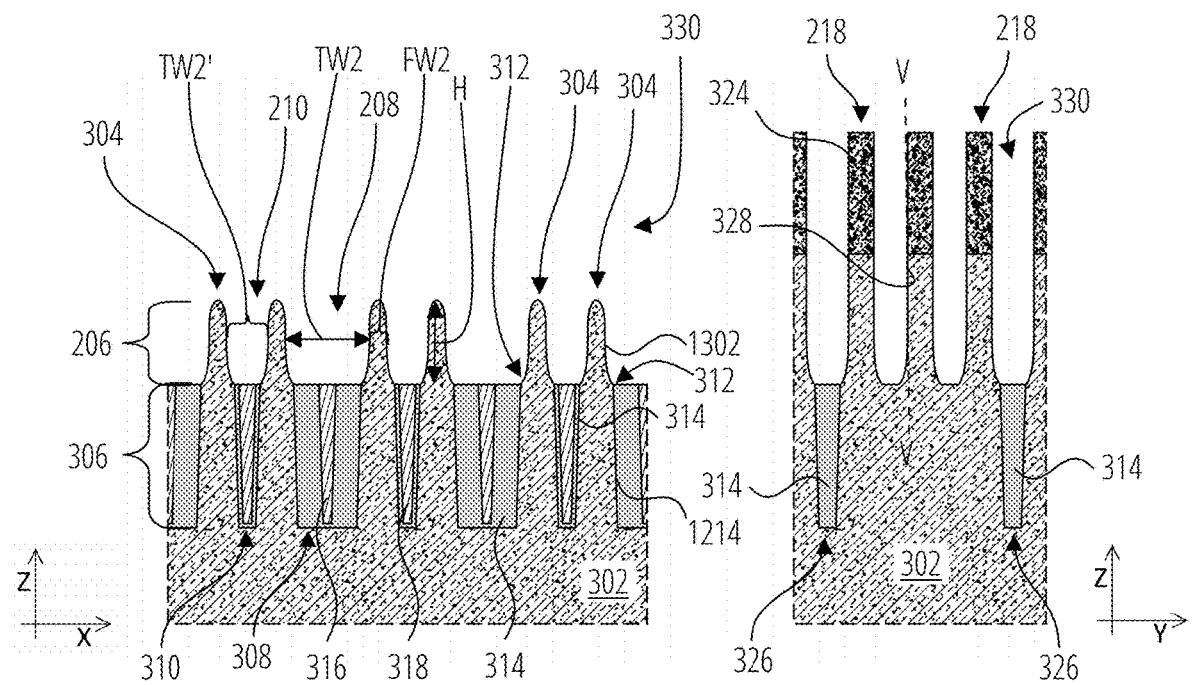

With collective reference to FIG. 13A and FIG. 13B, the bias voltage of the etching act may then be lowered (e.g., without a purge, air gap, and/or vacuum act to remove any materials, chemicals, or species from the fabrication equipment, such as an etching chamber) to the low bias voltage, to convert the etching chemistry from an anisotropic etchant to an isotropic etchant. In some embodiments, the same etching chemistry composition may be used for the low bias, isotropic etching act (FIG. 13A and FIG. 13B) as was used for the high bias, anisotropic etching act (FIG. 12A and FIG. 12B).

As described above with respect to FIG. 1C and FIG. 1D, the transition to the low bias, isotropic etching act may remove material from sidewalls of the silicon material (e.g., the base material 302) exposed to the etching chemistry at the low bias, isotropic etching act, without substantially removing material from upper surfaces of the silicon material and without removing material from the lower portions 306, which may not be exposed to the etching chemistry due to the presence of the insulative material(s) 314. For example, the low bias, isotropic etching act may remove base material 302 from along the sidewalls 1214 (FIG. 12A) exposed in the first initial trenches 1210 (FIG. 12A) and in the second initial trenches 1212 (FIG. 12A), forming sidewalls 1302 (FIG. 13A); and, the low bias, isotropic etching act may remove base material 302 (e.g., and, in some embodiments, the doped base material 104 of the doped portions 324) from along the sidewalls 1216 (FIG. 12B) otherwise exposed in the initial word line trenches 1202 (e.g., FIG. 12B), forming sidewalls 328 (FIG. 13B). Therefore, the first initial trenches 1210 (FIG. 12A) may widen from the initial trench width TW1 to the first trenches 208 (FIG. 13A) with trench width TW2; and the second initial trenches 1212 (FIG. 12A) may widen from the initial trench width TW1' to the second trenches 210 (FIG. 13A) with trench width TW2'. The wider trench widths (e.g., trench widths TW2 and TW2') may be about 10% to about 90% greater than the initial trench widths (e.g., initial trench widths TW1 and TW1'), respectively. Correspondingly, the upper fin portions 1208 (FIG. 12A) of the vertical structures 1206 of FIG. 12A may narrow, e.g., from initial fin width FW1 to fin width FW2, of the fins 206 of vertical structures 304. The narrower fin width FW2 may be about 10% to about 20% less than the initial fin width FW1.

As a result of the low bias, isotropic etching act, the sidewalls 1302 (FIG. 13A) of the fins 206 may be somewhat recessed relative to the sidewalls 1214 (FIG. 13A) of the lower portions 306, and the sidewalls 1302 may define a slope—relative to and above the insulative material(s) 314—that is less steep than the steepness of a slope defined by the sidewalls 1214 of the lower portions 306. Where the sidewalls 1302 of the fins 206 meet the sidewalls 1214 of the lower portions 306, the corner 312 may be distinguishable.

With regard to the "Y"-axis view, illustrated in FIG. 13B, the word line trenches 330 may also widen by about 10% to about 20% relative to the initial word line trenches 1202 (FIG. 12A) due to the use of the low bias, isotropic etching act after the high bias, anisotropic etching act.

Moreover, the low bias, isotropic etching act may result in the sidewalls 328 of the doped features 218 being substantially more vertical, e.g., within about one degree from true vertical (e.g., true ninety-degrees relative to horizontal), as represented by line V-V of FIG. 13B. Likewise, the sidewalls 1302 (FIG. 13A) of the first trenches 208 (FIG. 13A) and of the second trenches 210 (FIG. 13A) may be substantially more vertically, e.g., within about one degree from true vertical (e.g., true ninety-degrees relative to horizontal, such as relative to an upper surface of the insulative material(s) 314). That is, the low bias, isotropic etching act may cause more widening of the trenches, and more corresponding narrowing of the neighboring silicon structures nearer to the bases thereof than around mid-height or higher-still portions of the trenches and structures. For example, the initial trenches (e.g., the first initial trenches 1210 (FIG. 12A) and the second initial trenches 1212 (FIG. 12A)) may widen near the bases thereof by about 10% (e.g., to become the first trenches 208 (FIG. 13A) and the second trenches 210 (FIG. 13A), respectively), relative to the initial widths in an elevation near their bases; correspondingly, the neighboring structures (e.g., the upper fin portions 1208 (FIG. 12A) and the doped structures 1204 (FIG. 12B)) may narrow near the bases thereof by about 12% to about 15% (e.g., to become the fins 206 (FIG. 13A) and the doped features 218 (FIG. 12B), respectively), relative to the initial widths thereof in an elevation near their bases. The lower-elevation widening of trenches, and corresponding narrowing of adjacent structures, may be enabled by the use of the low bias in the low-bias, isotropic etching act. Accordingly, the lower-elevation widening of trenches and narrowing of structures may result in the sidewalls of the structures—and therefore the sidewalls that define the sides of the trenches—being closer to the true-vertical (e.g., ninety degree) profile, such as that represented by line V-V of FIG. 13B.

Forming the relatively narrow fins 206 (FIG. 13A) at the low bias may enable forming the fins 206 with reduced material damage at the surface of the fins 206, which may ultimately enable improved material quality, a lower row hammer characteristic, and lower write recovery time (TWR). The methods of forming the narrow silicon structures (e.g., narrow fins) of the apparatus may also enable the narrow silicon structures (e.g., fins 206) to be formed at a small horizontal critical dimension (e.g., fin width FW2) without also necessitating a smaller horizontal critical dimension of adjacent active areas 202 (FIG. 2). Accordingly, narrowing the fins 206 of the base material 302 (e.g., silicon) may not significantly lessen the potential "landing area" for other conductive structures of the apparatus, such as bit line contacts for bit lines 216 (FIG. 2).

Figures 14A, 14B:
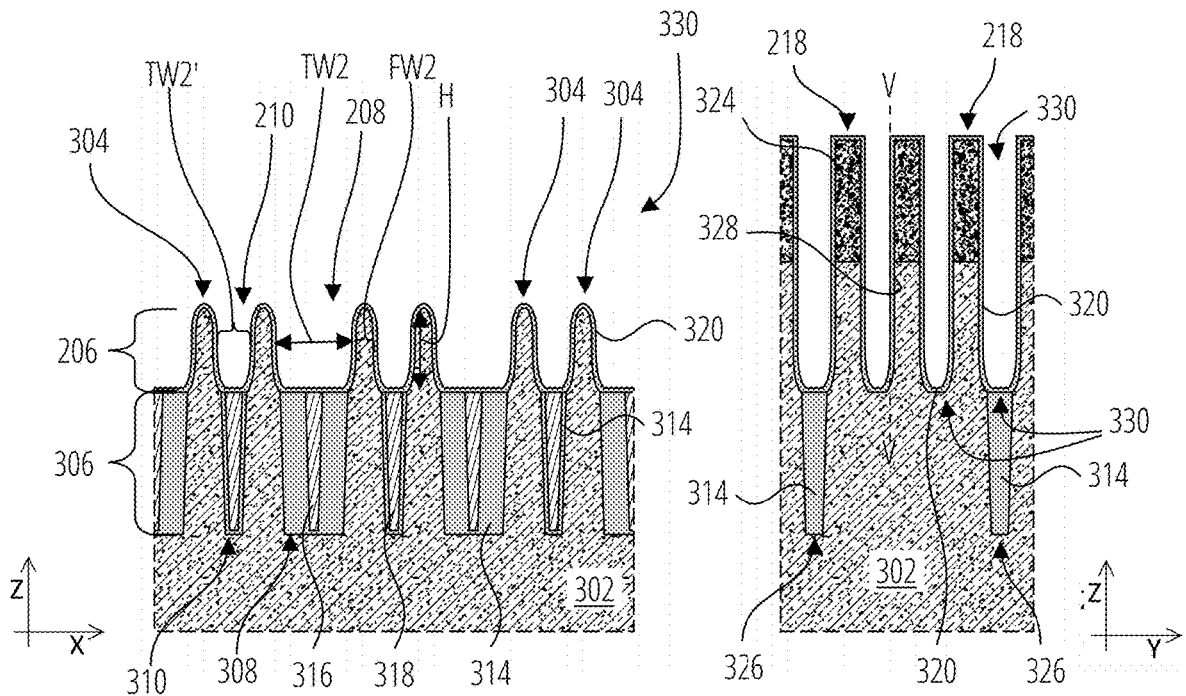

With collective reference to FIG. 14A and FIG. 14B, a liner 320 may then be formed (e.g., deposited, such as conformally deposited) on all exposed surfaces of the structure, including on the fins 206 (FIG. 14A), on the doped features 218 (FIG. 14B), in the first trenches 208 (FIG. 14A), in the second trenches 210 (FIG. 14A), and in the remainder of the word line trenches 330 (FIG. 14A and FIG. 14B).

Figures 15A, 15B:
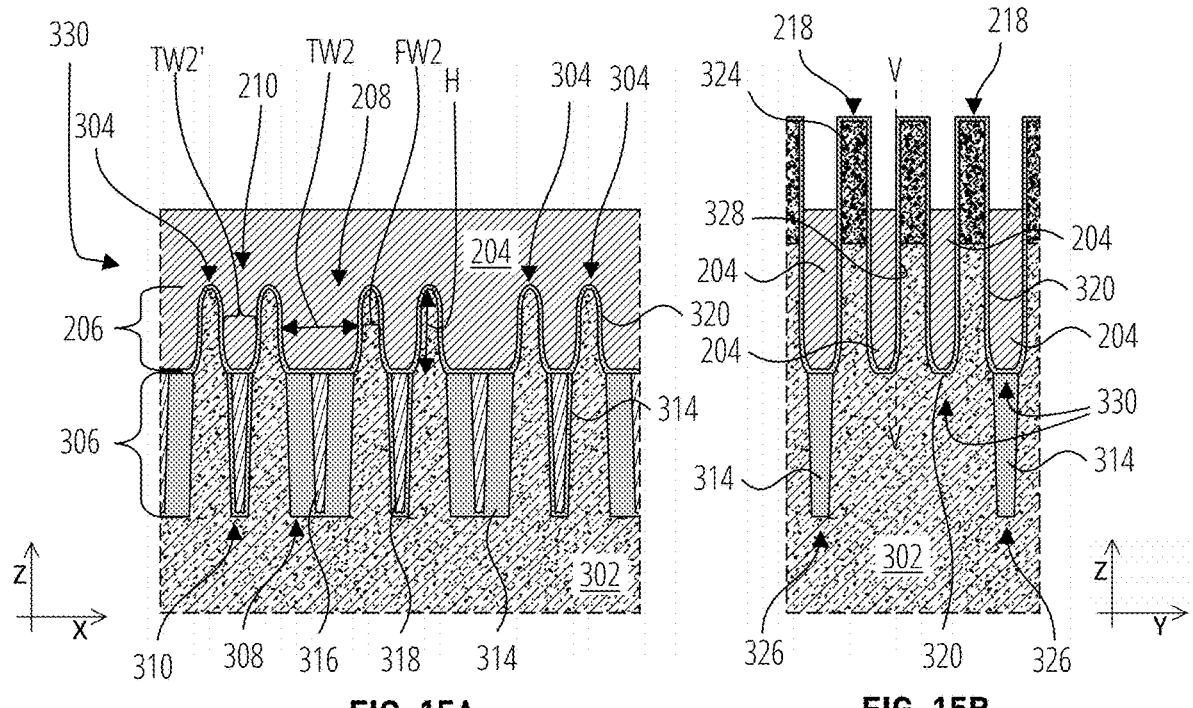

With collective reference to FIG. 15A and FIG. 15B, the conductive material of the word lines 204 may then be formed (e.g., deposited) to at least partially fill the word line trenches 330. An upper portion of the word line trenches 330 may be left unfilled, or the conductive material of the word lines 204 may be recessed (e.g., after initial formation) to leave an unfilled portion of the word line trenches 330 atop the word lines 204. Insulative material may then be formed (e.g., deposited) on the word lines 204 to fill the remaining portions of the word line trenches 330, forming the insulative cap structures 322 of FIG. 3A and FIG. 3B.

By forming the microelectronic device structure 300 (FIG. 3A and FIG. 3B) according to a method that includes the low bias, isotropic etching act after the high bias, anisotropic etching act—e.g., to narrow silicon structures (e.g., the fins 206) and to broaden the adjacent trenches (e.g., the first trenches 208, the second trenches 210, and other portions of the word line trenches 330), the word lines 204 may be formed with a relatively greater quantity of conductive material in the word line trenches 330 and between the fins 206. The substantially more vertical sidewalls 328 (FIG. 15B) of the doped features 218—and therefore also of the word line trenches 330—may accommodate forming the greater quantity of conductive material, of the word lines 204, throughout substantially the whole height of the word lines 204, because a base of the word line trenches 330 may be broader—due to the use of the low bias, isotropic etching act—than it otherwise would be. The greater quantity of conductive material may enable improved control of the word lines 204, a lower row hammer characteristic, and lower refresh and/or write recovery time. For example, the row hammer improvement—due to the use of the low bias, isotropic etching step during the fabrication of the microelectronic device structures 300 (FIG. 3A and FIG. 3B)—may be a decrease of about 15% to about 20%. It is further contemplated that the drive current of the apparatus may be higher than it otherwise would have been, without use of the low bias, isotropic etching act.

The low bias, isotropic etching act—following at least one high bias, anisotropic etching act—may also be used to form other features of microelectronic apparatus. For example, a low bias, isotropic etching act may be used—following a high bias, anisotropic etching act—to form a contact opening extending at least partially through a silicon material, so as to form an opening such as a bit contact opening. Accordingly, such contact openings may be formed to be broader and with more vertical sidewalls, to accommodate a greater quantity of conductive material forming the respective contact structures.

Figure 16:
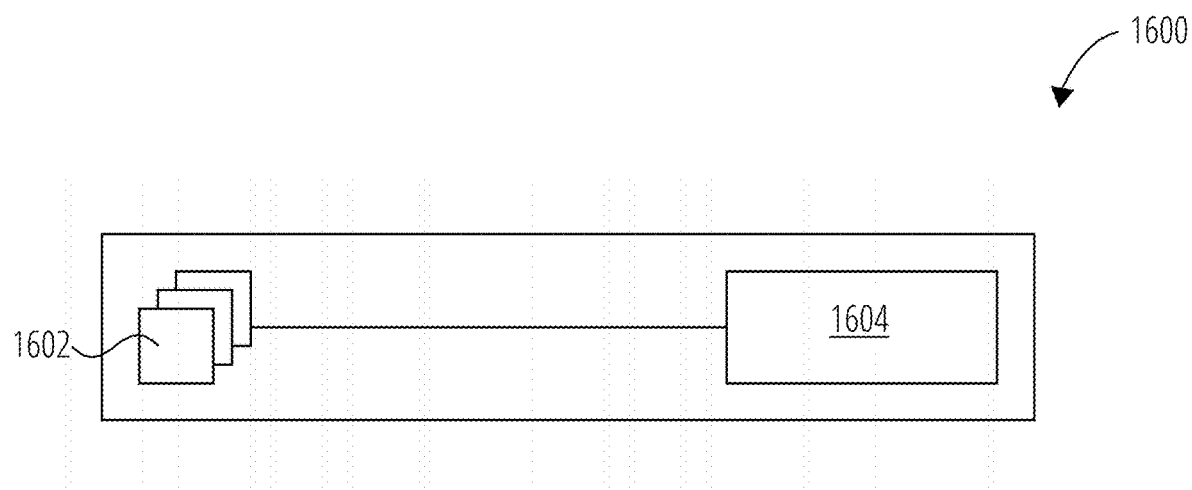
FIG. 16 is a simplified block diagram of a semiconductor device structure including an array of semiconductor devices (e.g., memory devices) including relatively broad openings (e.g., trenches) adjacent relatively narrow structures (e.g., fins) formed in accordance with embodiments of the disclosure.

With reference to FIG. 16, illustrated is a simplified block diagram of a semiconductor device 1600 implemented according to one or more embodiments described herein. The semiconductor device 1600 includes an array 1602 of memory devices (e.g., the memory cell array 200 of FIG. 2), one or more of which may include microelectronic device structures described above (e.g., the microelectronic device structure 300 of FIG. 3A and FIG. 3B), including narrow fins and broad trenches structured and/or formed according to any of the embodiments discussed above. The control logic component 1604 may be configured to interact with the array 1602 so as to read from or write to any or all memory devices within the array 1602.

Figure 17:
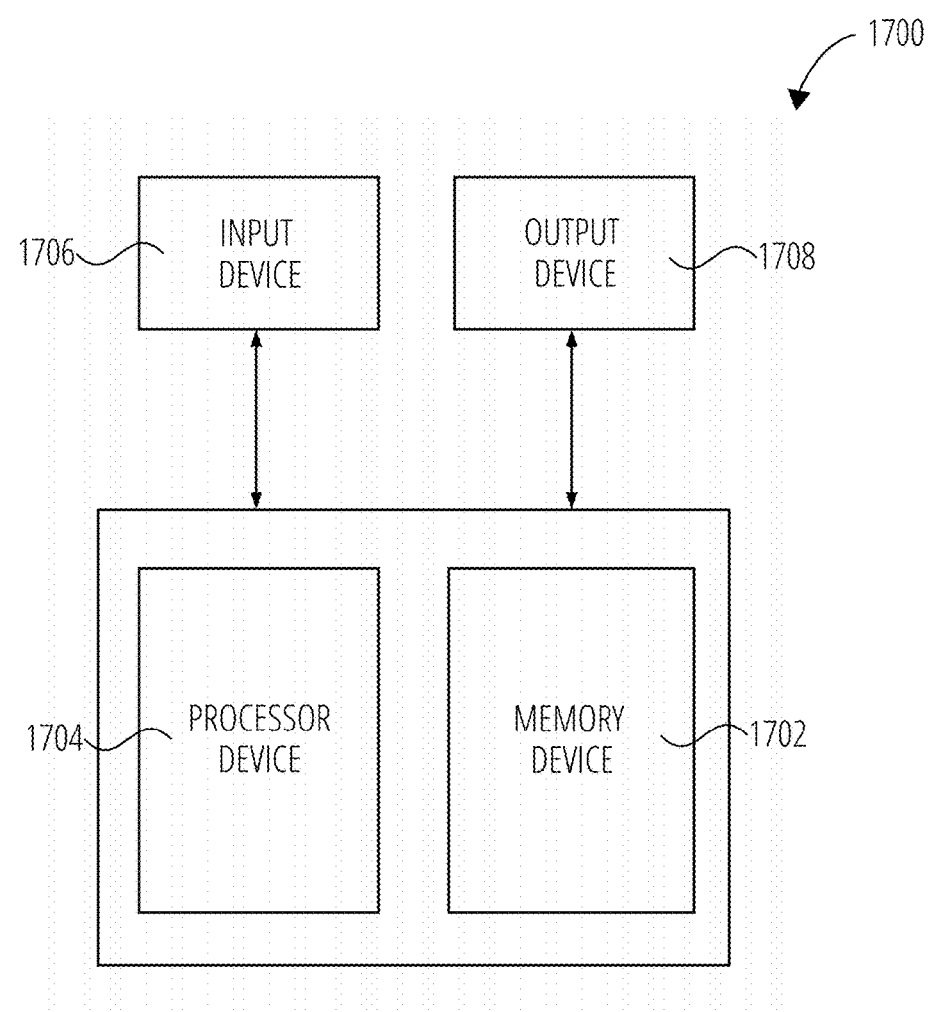
FIG. 17 is a schematic block diagram illustrating an electronic system, in accordance with embodiments of the disclosure.

Electronic devices (e.g., semiconductor devices, memory devices (e.g., DRAM devices)) that include microelectronic device structures 300 (FIG. 3A and FIG. 3B) or arrays of any thereof (e.g., in the memory cell array 200 of FIG. 2, the array 1602 of FIG. 16), in accordance with embodiments of the disclosure, may be used in embodiments of electronic systems of the disclosure. For example, FIG. 17 is a block diagram of an illustrative electronic system 1700, according to embodiments of the disclosure. The electronic system 1700 may comprise, e.g., a computer or computer hardware component, a server or other networking hardware component, a cellular telephone, a digital camera, a personal digital assistant (PDA), portable medial (e.g., music) player, etc. The electronic system 1700 includes at least one memory device 1702. The electronic system 1700 may further include at least one electronic signal processor device 1704 (which may otherwise be referred to in the art as a "microprocessor"). At least one of the electronic signal processor device 1704 and the at least one memory device 1702 may include, e.g., an embodiment of the microelectronic device structure 300 (FIG. 3A and FIG. 3B) or arrays of any thereof (e.g., in the memory cell array 200 of FIG. 2, the array 1602 of FIG. 16). The at least one memory device 1702 and the at least one electronic signal processor device 1704 may be combined on a "system on a chip (SoC)." Therefore, at least one of the electronic signal processor device 1704 and the at least one memory device 1702 may include an embodiment of the narrow fins and adjacent, broad trenches—formed by a low bias, isotropic etching act following at least one high bias, anisotropic etching act.

The electronic system 1700 may further include one or more input devices 1706 for inputting information into the electronic system 1700 by a user, e.g., a pointing device (e.g., a mouse), a keyboard, a touchpad, a button, a control panel, or combinations thereof. The electronic system 1700 may further include one or more output devices 1708 for outputting information (e.g., visual output, audio output) to a user, e.g., a monitor, a display, a printer, an audio output jack, a speaker, etc. In some embodiments, the input device 1706 and the output device 1708 may comprise a device configured for both input and output (e.g., a touch screen device) that can be used both to input information into the electronic system 1700 and to output visual information to a user. The one or more input devices 1706 and output devices 1708 may communicate electrically with at least one of the memory device 1702 and the electronic signal processor device 1704.

Accordingly, disclosed is an electronic system comprising an input device, an output device, a processor device, and a memory device. The processor device is operably coupled to the input device and to the output device. The memory device is operably coupled to the processor device. The memory device comprises at least one microelectronic device structure. The at least one microelectronic device structure comprises, in at least one word line trench of word line trenches, vertical structures, insulative material, and a conductive word line. The vertical structures are formed in a silicon material. The vertical structures are arranged in a series along a first axis. A vertical structure, of the vertical structures, comprises a fin portion, a lower portion, and a corner. The lower portion is below the fin portion. The corner is where a sidewall of the fin portion meets a sidewall of the lower portion. The insulative material is in a trench adjacent the vertical structure. An upper surface of the insulative material is at an elevation of the corner of the vertical structure. The conductive word line is over and laterally adjacent the fin portion. The word line trenches are arranged parallel to one another and parallel to the first axis. Sidewalls—of the silicon material adjacent the word line trenches—define a slope, relative to an upper surface of the insulative material, of at least about eighty-nine degrees.

While the disclosed structures, apparatuses (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A method of forming an apparatus comprising a memory cell array comprising microelectronic devices, the method comprising:
    forming at least one isolation trench in a silicon structure, the silicon structure comprising at least one dopant adjacent an upper surface of the silicon structure;
    at least partially filling the at least one isolation trench with insulative material;
    forming at least one opening within the insulative material in the at least one isolation trench;
    forming conductive material within the at least one opening to form at least one lower elongate conductive structure within the at least one isolation trench;
    exposing the silicon structure and the insulative material to an etching chemistry at a first bias voltage of greater than about 500 V, comprising vertically etching regions of the silicon structure adjacent the at least one isolation trench and vertically etching the insulative material within the at least one isolation trench to form at least one initial trench above the insulative material and between sidewalls of initial features formed in the silicon structure;
    exposing at least the sidewalls of the initial features above the insulative material to the etching chemistry at a second bias voltage of less than about 100 V to remove material from the sidewalls to expand the at least one initial trench and form at least one broader trench above the insulative material and between features formed from the initial features without substantially reducing a height of the initial features; and
    forming elongate conductive structures in the at least one broader trench and above the features,
whereby at least one of the microelectronic devices formed by the method comprises: whereby the features comprising silicon of the silicon structure, each feature of at least one pair of the features comprising:
    a lower portion with a tapering sidewall adjacent the at least one broader trench at least partially filled with the insulative material; and
    a fin portion above the lower portion, the fin portion comprising a sidewall defining a different slope above the insulative material than a slope of the tapering sidewall of the lower portion of the feature;
    the elongate conductive structures above the features, the elongate conductive structures comprising portions laterally adjacent the fin portion of the each feature of the at least one pair of the features, the elongate conductive structures being arranged parallel to one another and parallel to a first horizontal axis;
    doped features comprising the silicon in other regions not vertically etched during the exposure to the etching chemistry at the first bias voltage, the doped features comprising the at least one dopant, the doped features spacing the elongate conductive structures from one another along a second horizontal axis perpendicular to the first horizontal axis; and
    within the at least one isolation trench, the at least one lower elongate conductive structure extending substantially perpendicular to the elongate conductive structures;
wherein:
    the conductive material of the at least one lower elongate conductive structure comprises one or more of titanium (Ti), tungsten (W), ruthenium (Ru), cobalt (Co), an alloy of any of the foregoing, or one or more compounds or combinations of any of the foregoing,
    the insulative material is interposed between the at least one lower elongate conductive structure and the lower portion of the feature, and
    the doped features extend to a higher elevation than the fin portions of the features.

2. The method of claim 1, wherein:
exposing the silicon structure and the insulative material to the etching chemistry at the first bias voltage comprises exposing the silicon structure and the insulative material to a plasma etchant composition at the first bias voltage; and
exposing at least the sidewalls of the initial features above the insulative material to the etching chemistry at the second bias voltage comprises exposing upper surfaces of the initial features and exposing the sidewalls of the initial features above the insulative material to the plasma etchant composition at the second bias voltage.

3. The method of claim 1, further comprising selecting the etching chemistry to comprise a plasma comprising at least one of $CF_4$, $C_2F_2$, $C_4F_6$, $O_2$, HBr, or $Cl_2$.

4. The method of claim 1, wherein forming the elongate conductive structures in the at least one broader trench and above the features comprises forming at least one conductive material in the at least one broader trench, the at least one conductive material comprising at least one of titanium (Ti), tungsten (W), ruthenium (Ru), and cobalt (Co).

5. The method of claim 4, further comprising, before forming the at least one conductive material in the at least one broader trench, forming at least one insulative liner in the at least one broader trench.

6. The method of claim 1, wherein exposing at least the sidewalls of the initial features above the insulative material to the etching chemistry at the second bias voltage comprises, lowering a bias voltage from the first bias voltage to the second bias voltage without purging material from an etchant chamber containing the silicon structure and the at least one etching chemistry.

7. The method of claim 1, wherein exposing at least the sidewalls of the initial features above the insulative material to the etching chemistry at the second bias voltage comprises expanding, by between about 10% to about 90%, a horizontal width of the at least one initial trench to form the at least one broader trench.

8. The method of claim 1, further comprising, before exposing the silicon structure to the etching chemistry at the first bias voltage, adding the at least one dopant to the silicon structure adjacent the upper surface of the silicon structure.

9. The method of claim 1, wherein exposing at least the sidewalls of the initial features above the insulative material to the etching chemistry at the second bias voltage further comprises exposing sidewalls of the doped features above the insulative material to the etching chemistry at the second bias voltage to alter the sidewalls of the doped features to have, above the insulative material, a slope within one degree of vertical.

10. The method of claim 1, wherein exposing at least the sidewalls of the initial features above the insulative material to the etching chemistry at the second bias voltage comprises exposing at least the sidewalls of the initial features above the insulative material to the etching chemistry for a total time of less than about 10 seconds.

11. The method of claim 10, wherein exposing the silicon structure and the insulative material to the etching chemistry at the first bias voltage comprises exposing the silicon structure and the insulative material to the etching chemistry at the first bias voltage for a total time of greater than about 300 seconds.

12. An apparatus, comprising:
a memory cell array comprising microelectronic devices, at least one of the microelectronic devices comprising:
features comprising silicon, each feature of at least one pair of the features comprising:
a lower portion with a tapering sidewall adjacent a trench at least partially filled with insulative material; and
a fin portion above the lower portion, the fin portion comprising a sidewall defining a different slope above the insulative material than a slope of the tapering sidewall of the lower portion of the feature; and
elongate conductive structures above the features, the elongate conductive structures comprising portions laterally adjacent the fin portion of the each feature of the at least one pair of the features, the elongate conductive structures being arranged parallel to one another and parallel to a first horizontal axis;
doped features comprising the silicon and at least one dopant, the doped features spacing the elongate conductive structures from one another along a second horizontal axis perpendicular to the first horizontal axis; and
within the trench, at least one additional elongate conductive structure extending substantially perpendicular to the elongate conductive structures,
wherein:
the at least one additional elongate conductive structure comprises one or more of titanium (Ti), tungsten (W), ruthenium (Ru), cobalt (Co), an alloy of any of the foregoing, or one or more compounds or combinations of any of the foregoing,
the insulative material is interposed between the at least one additional elongate conductive structure and the lower portion of the feature, and
the doped features extend to a higher elevation than the fin portions of the features.

13. The apparatus of claim 12, wherein sidewalls of the elongate conductive structures define a slope of at least eighty-nine degrees relative to an upper surface of the insulative material.

14. The apparatus of claim 13, wherein the slope of the tapering sidewall of the lower portion is within one degree of vertical.

15. The apparatus of claim 12, wherein the doped features have sidewalls exhibiting a slope within one degree of vertical.

16. An electronic system, comprising:
an input device;
an output device;
a processor device operably coupled to the input device and to the output device; and
a memory device operably coupled to the processor device and comprising a memory cell array comprising microelectronic devices, at least one of the microelectronic devices comprising, in at least one word line trench of word line trenches:
vertical features comprising a silicon material, the vertical features arranged in a series along a first horizontal axis, each vertical feature of at least one pair of the vertical features comprising:
a lower portion with a tapering sidewall adjacent a lower trench at least partially filled with insulative material;
a fin portion above the lower portion, the fin portion comprising a sidewall defining a different slope above the insulative material than a slope of the tapering sidewall of the lower portion of the vertical feature; and
a corner where the sidewall of the fin portion meets the tapering sidewall of the lower portion, an elevation of the corner of the vertical feature being an elevation of an upper surface of the insulative material;
elongate conductive structures above the vertical features, the elongate conductive structures being arranged parallel to one another and parallel to the first horizontal axis;
doped features comprising the silicon and at least one dopant, the doped features spacing the elongate conductive structures from one another along a second horizontal axis perpendicular to the first horizontal axis; and
within the lower trench, at least one additional elongate conductive structure extending substantially perpendicular to the elongate conductive structures,
wherein:
the at least one additional elongate conductive structure comprises one or more of titanium (Ti), tungsten (W), ruthenium (Ru), cobalt (Co), an alloy of any of the foregoing, or one or more compounds or combinations of any of the foregoing,
the insulative material is interposed between the at least one additional elongate conductive structure and the lower portion of the vertical feature,
the doped features extend to a higher elevation than the fin portions of the vertical features, and
sidewalls of the silicon material adjacent the word line trenches define a slope, relative to the upper surface of the insulative material, of at least about eighty-nine degrees.

* * * * *

UNITED STATES PATENT AND TRADEMARK OFFICE
CERTIFICATE OF CORRECTION

PATENT NO. : 11,877,434 B2
APPLICATION NO. : 16/924995
DATED : January 16, 2024
INVENTOR(S) : Yan Li et al.

It is certified that error appears in the above-identified patent and that said Letters Patent is hereby corrected as shown below:

In the Specification

| | | |
|---|---|---|
| Column 1, | Line 36, | change "and cell junction leakage)," to --and cell-junction leakage),-- |
| Column 3, | Line 25, | change "but also by way" to --but also—by way-- |
| Column 3, | Line 50, | change "oxide (NbO—$_x$—)," to --oxide (NbO$_x$),-- |
| Column 3, | Line 58, | change "HfO$_x$, NbO—$_x$, TiO$_x$," to --HfO$_x$, NbO$_x$, TiO$_x$,-- |
| Column 4, | Line 22, | change "insulator ("SOT") substrates," to --insulator ("SOI") substrates,-- |

In the Claims

| | | | |
|---|---|---|---|
| Claim 1, | Column 21, | Line 48, | change "comprises: whereby the features" to --comprises: the features-- |

Signed and Sealed this
Second Day of April, 2024

Katherine Kelly Vidal
*Director of the United States Patent and Trademark Office*